US011137867B2

(12) United States Patent
Lazzi et al.

(10) Patent No.: US 11,137,867 B2
(45) Date of Patent: Oct. 5, 2021

(54) FLUIDIC WIRE TOUCH SENSORS

(71) Applicant: Teveri LLC, Salt Lake City, UT (US)

(72) Inventors: Gianluca Lazzi, Salt Lake City, UT (US); Dulce Maria Altabella Lazzi, Salt Lake City, UT (US); Kyle Loizos, Salt Lake City, UT (US)

(73) Assignee: Teveri LLC, Salt Lake City, UT (US)

( * ) Notice: Subject to any disclaimer, the term of this patent is extended or adjusted under 35 U.S.C. 154(b) by 0 days.

(21) Appl. No.: 16/341,041

(22) PCT Filed: Oct. 11, 2017

(86) PCT No.: PCT/US2017/056198
§ 371 (c)(1),
(2) Date: Apr. 10, 2019

(87) PCT Pub. No.: WO2018/071580
PCT Pub. Date: Apr. 19, 2018

(65) Prior Publication Data
US 2019/0235671 A1 Aug. 1, 2019

Related U.S. Application Data

(60) Provisional application No. 62/406,822, filed on Oct. 11, 2016.

(51) Int. Cl.
*G06F 3/045* (2006.01)
*G06F 3/047* (2006.01)
(Continued)

(52) U.S. Cl.
CPC ............... *G06F 3/047* (2013.01); *G06F 1/16* (2013.01); *G06F 3/041* (2013.01); *G06F 3/0414* (2013.01); *H01B 1/02* (2013.01); *H03K 19/1733* (2013.01)

(58) Field of Classification Search
CPC . G06F 3/047; G06F 1/16; G06F 3/041; G06F 3/0414; H01B 1/02; H03K 19/1733
See application file for complete search history.

(56) References Cited

U.S. PATENT DOCUMENTS

| | | |
|---|---|---|
| 2004/0037708 A1 | 2/2004 | Murasato et al. |
| 2012/0118066 A1* | 5/2012 | Majidi .................... A61B 5/11 |
| | | 73/719 |

(Continued)

FOREIGN PATENT DOCUMENTS

| | | |
|---|---|---|
| KR | 20030014226 A | 2/2003 |
| WO | 2012050938 A2 | 4/2012 |
| WO | 2018018023 A1 | 1/2018 |

OTHER PUBLICATIONS

PCT International Preliminary Report on Patentability in PCT International Application Serial No. PCT/US2017/056198 dated Apr. 16, 2019 (11 pages).

(Continued)

*Primary Examiner* — Adam R. Giesy
(74) *Attorney, Agent, or Firm* — Alliance IP, LLC

(57) ABSTRACT

A touch sensor is provided which includes one or more liquid metal wires and detection circuitry to detect a change in an electrical attribute of the one or more liquid metal cavities based on a depression of the one or more liquid metal cavities, and indicate a touch event corresponding to the depression of the one or more liquid metal cavities based on the change in the electrical attribute.

24 Claims, 21 Drawing Sheets

HOLLOW PIN INSERTED INTO CHANNEL

TUBING IN LIQUID-METAL-BASED DEVICE

LIQUID METAL

(51) Int. Cl.
    *H01B 1/02*     (2006.01)
    *G06F 1/16*     (2006.01)
    *G06F 3/041*     (2006.01)
    *H03K 19/173*     (2006.01)

(56) References Cited

U.S. PATENT DOCUMENTS

| | | |
|---|---|---|
| 2012/0222944 A1 | 9/2012 | Kim et al. |
| 2014/0071583 A1 | 3/2014 | Rofougaran |
| 2014/0238153 A1* | 8/2014 | Wood ...................... B25J 13/08 |
| | | 73/862.627 |
| 2018/0243924 A1* | 8/2018 | Visell ...................... G01L 5/228 |

OTHER PUBLICATIONS

PCT International Search Report and Written Opinion in PCT International Application Serial No. PCT/US2017/056198 dated Feb. 1, 2018 (15 pages).

PCT International Preliminary Report on Patentability in PCT International Application No. PCT/US2017/056198 dated Feb. 1, 2018 (15 pages).

* cited by examiner

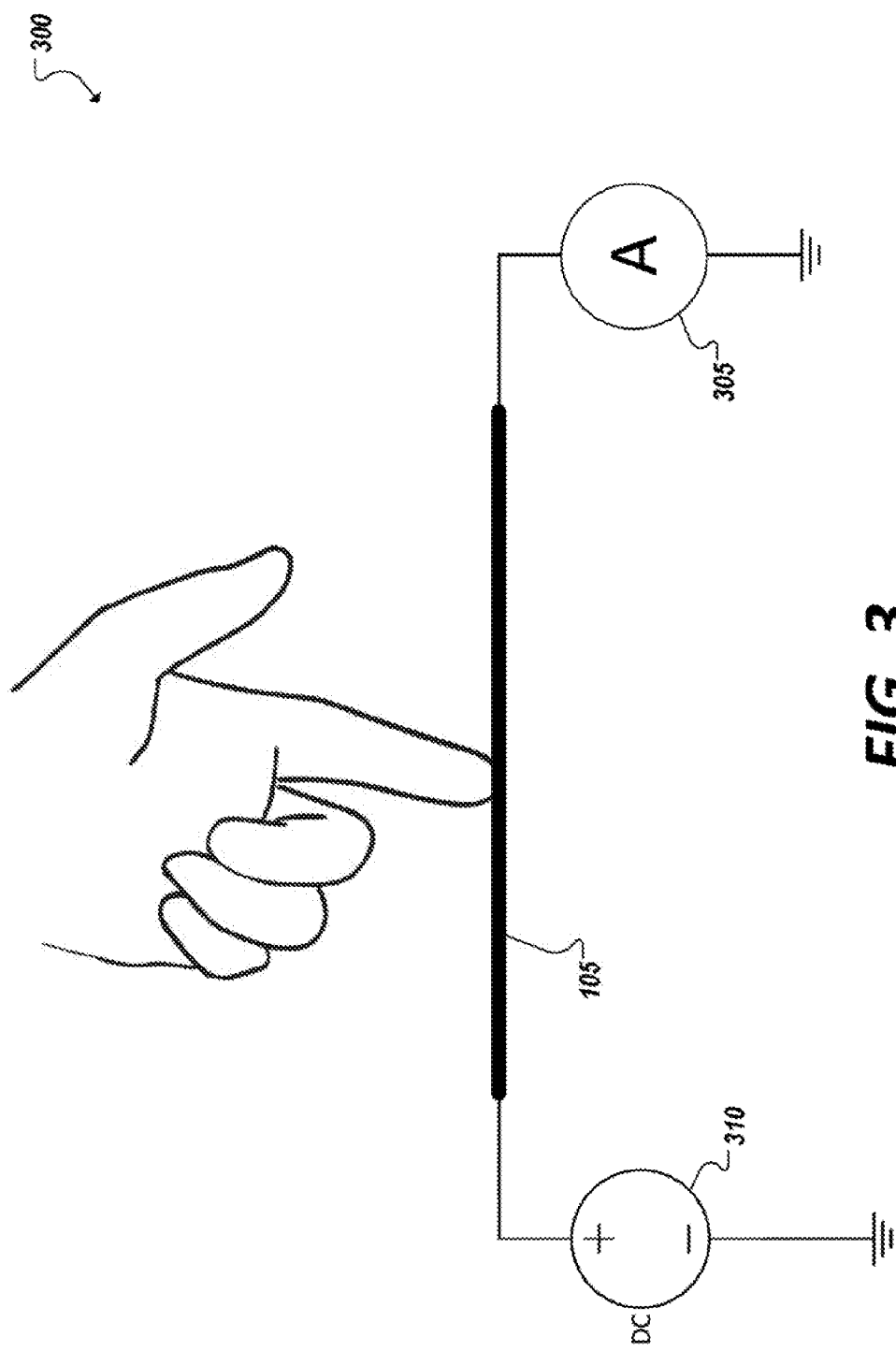

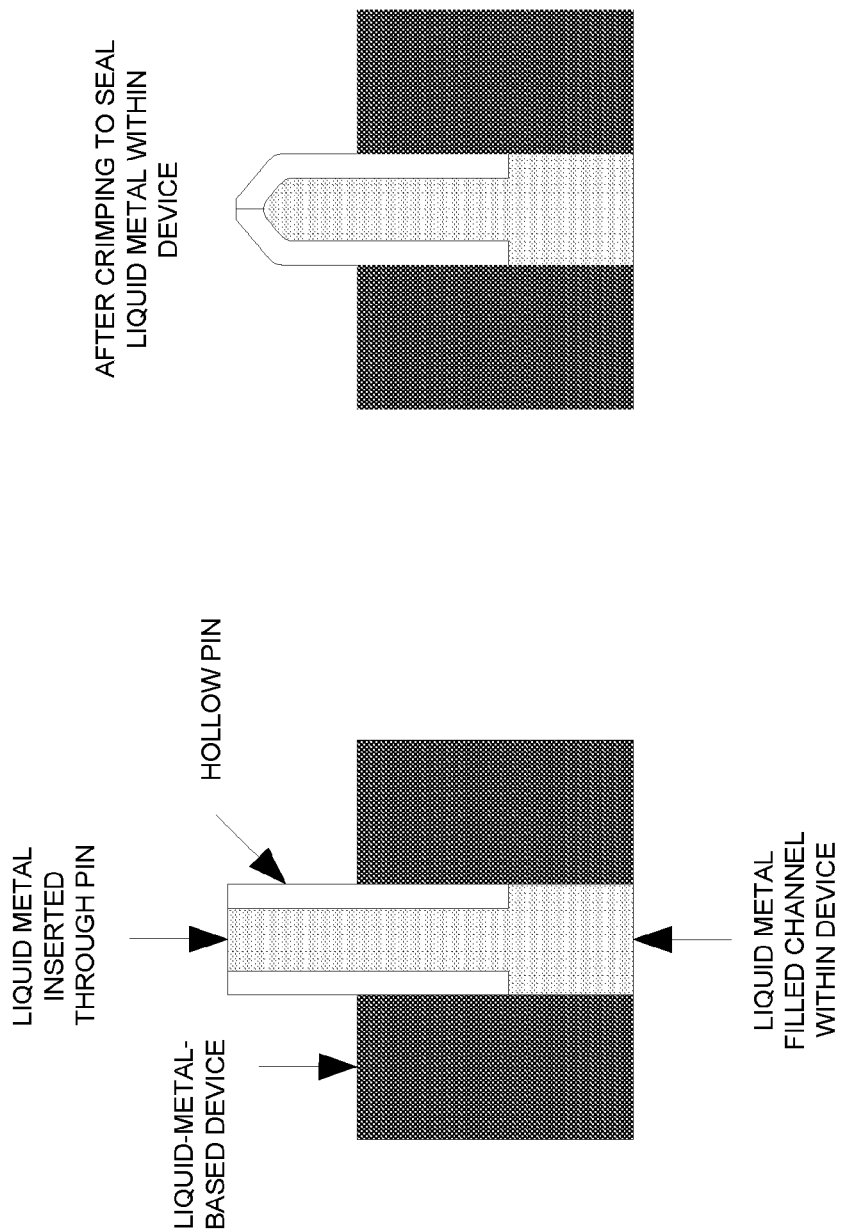

FLUIDIC WIRE TOUCH SENSORS

CROSS-REFERENCE TO RELATED APPLICATIONS

This application is a national stage application under 35 U.S.C. § 371 of PCT International Application Serial No. PCT/US2017/056198, filed on Oct. 11, 2017 and entitled FLUIDIC WIRE TOUCH SENSORS, which application claims the benefit of priority to U.S. Provisional Patent Application Ser. No. 62/406,822, filed on Oct. 11, 2016. The disclosures of the prior applications are considered part of and are hereby incorporated by reference herein in their entirety in the disclosure of this application.

BACKGROUND

The present disclosure relates in general to the field of computer systems, and more specifically, to deformable electronic devices.

Computing devices such as personal computers, laptop computers, tablet computers, cellular phones, and countless types of Internet-capable devices are increasingly prevalent in numerous aspects of modern life. Over time, the manner in which these devices are providing information to users is becoming more intelligent, more efficient, more intuitive, and/or less obtrusive. The trend toward miniaturization of computing hardware, peripherals, as well as of sensors, detectors, and image and audio processors, among other technologies, has helped open up a field sometimes referred to as "wearable computing." A variety of wearable computing devices are being developed allowing electronic components to be carried on human and animal users.

BRIEF DESCRIPTION OF THE DRAWINGS

FIG. 3 illustrates a simplified block diagram of an example touch sensor implemented using a liquid metal wire.

FIGS. 13-21 are diagrams of example connector elements for use in interfacing with liquid metal wires.

Like reference numbers and designations in the various drawings indicate like elements.

DETAILED DESCRIPTION

Figure 1A:
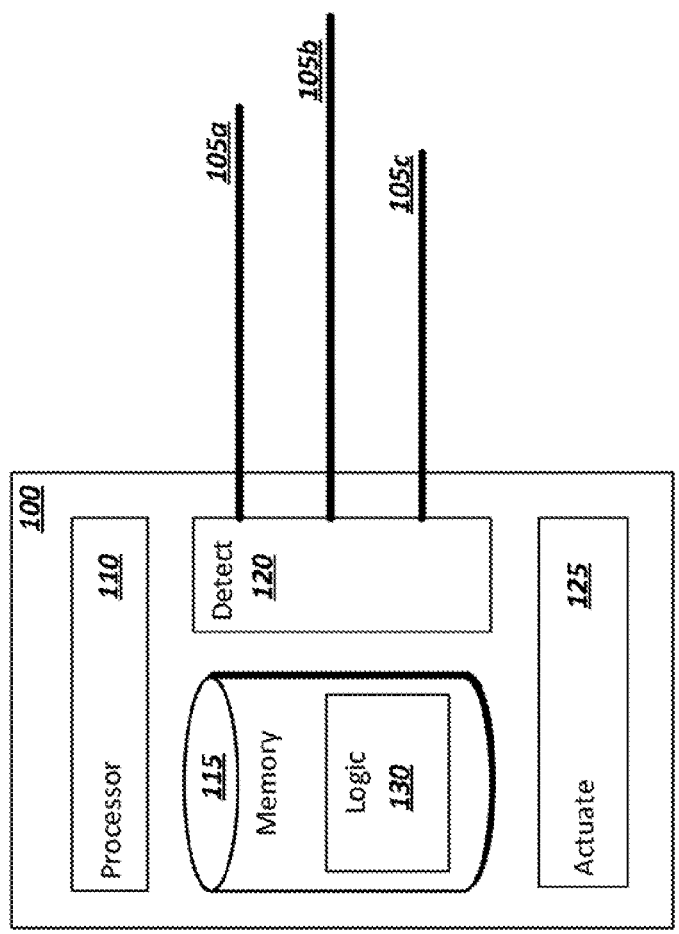
FIG. 1A illustrates a simplified schematic diagram of an example system including one or more touch sensors implemented using one or more liquid metal cavities.

The subject matter described herein provides for touch sensors constructed from reversibly deformable and mechanically tunable fluidic cavities containing liquid metal (also referred to herein as "liquid metal cavities"). Cavities within this context may refer to an elastomeric structure, which may contain form a volume in which liquid metal may be contained. Liquid metal cavities may define and house liquid metal in potential any geometry. In some instances, liquid metal cavities may be formed from elastomeric capillaries (or potentially any cross-sectional geometry) to form a liquid metal wire when filled with liquid metal. In other examples, liquid metal cavities may be embodied as a bubble or blister of potentially any geometry (e.g., rounded, angular, or irregular shaped) to house liquid metal, among other examples.

The reversibly deformable and mechanically tunable fluidic cavities may be formed by injecting a liquid metal, such as gallium or a gallium-based alloy, into one or more sheaths or other cavities within a material substrate or a base material (e.g., coupled to a bonding layer material). Any liquid metal that has a melting point below an ambient liquid metal device manufacturing facility temperature or the temperature of the desired operating environment may be used such that heating of the liquid metal is not required for the liquid metal to be introduced during manufacturing or for the liquid metal to retain its deformable properties in application. An example temperature range from negative twenty degrees Celsius (−20° C.) to forty degrees Celsius (40° C.) may be used in association with certain of the metals described herein that are in a liquid state within this range, though it is understood that other temperature ranges may be appropriate for other implementations of liquid metal to be used to form a reversibly deformable and mechanically tunable fluidic cavity. In one example, eutectic gallium indium (EGaIn) has a melting point of fifteen and seven tenths degrees Celsius (15.7° C.) and given the supercooling property of gallium may maintain this liquid property at temperatures even lower than its melting point, allowing EGaIn (and other gallium-based alloys) to be used as the liquid metal within an example fluidic cavity. For instance, a gallium-based allow including other metals, such as tin (e.g., Galistan), gold, etc. may be utilized as the liquid metal. As such, a lower end of the ambient liquid metal cavity manufacturing facility temperature range for such an implementation may be considered, for example, sixteen degrees Celsius (16° C.). Other metals and temperature ranges may be used for formation of liquid metal cavities that may have higher or lower melting points, and as such, different ambient liquid metal device manufacturing facility temperature ranges.

In some cases, a fluidic cavity, such as a fluidic wire, may be constructed by injecting the liquid metal into a wire housing or sheath, or other cavity. As an alternative to injecting a liquid metal into one or more cavities, the liquid metal may be drawn into a cavity by applying a vacuum or other pulling force to the liquid metal via the cavity. In either implementation, injecting or drawing the liquid metal into the cavity may be terminated in response to the cavity filling to capacity. Alternatively, filling the cavity may be terminated on demand by cessation of the filling process upon filling of the cavity to an extent sufficient to allow radiation of electromagnetic energy via the fluidic wire. Inlet and outlet filling hole locations may be provided for the respective operations, and the cavity may be sealed in response to filling the cavity.

The term "fluidic wire" and "liquid metal wire" may be used interchangeably to represent a wire with a liquid metal resonant element. The term "material" and "substrate" may be used interchangeably to represent a substance within which a fluidic wire may be formed. The term "cavity" may be used to represent a hollow channel, capillary, conduit, sheath, groove, bubble, furrow or other structure within a substrate within which liquid metal may be filled to form a fluidic cavity. The terms "cavity," "channel," and "capillary" or other terms may be used interchangeably hereafter to identify a void or other structure, within one or more portions of material that define a shape of a fluidic cavity, that may be filled with liquid metal to form a fluidic cavity. For certain implementations, a channel may be considered a "microfluidic channel."

The material within which liquid metal is to be introduced to form a liquid metal may include a flexible and/or stretchable material, for example, an elastomer such as silicone or other polymer-based materials. Other examples of flexible materials include polymer films, composite substrates, gels, thin metal supports, and other flexible materials. The material within which the cavity is formed may also include rigid materials such as wood, dry wall, polymeric parts, polymer films, gels, and other rigid materials. It is understood that the present subject matter applies to any material that may form a cavity that may define a desired shape for the fluidic cavity and all such materials are within the scope of the present subject matter. Some application-specific restrictions may be considered, such as for fluidic wires, where the material may be selected to avoid interfering with spectral properties of the fluidic wire beyond interference acceptable within a given implementation, among other examples.

A cavity may be formed into a substrate in a variety of manners. Because the cavity is formed with a liquid metal, the mechanical properties of the cavity may be defined by mechanical properties of the substrate. As such, for an elastomeric substrate, the resulting elastomeric fluidic cavity may be deformed (e.g., stretched, bent, flexed, rolled, etc.) and released/reversed without loss of electrical continuity. As a consequence, the resulting cavities, such as liquid metal wires, may be more durable relative to conventional technologies and may be utilized in applications that would otherwise result in destruction of conventional sensors. Strain may be induced in a material, for example, in response to temperature changes, pressure changes, mechanical load changes, geographical changes, or any other change that results in a force on the material that deforms, elongates, shrinks, or otherwise changes the material's dimensions. For example, the fluid metal may flow in response to strain (e.g., elongation) of the elastomeric substrate, resulting in a reconfiguration of the geometry of the fluidic wire and a resulting shift in the resonant frequency of the wire, while returning to its original geometry and frequency response upon removal of the applied strain. Based upon these properties, the fluidic wire is considered to have no or minimal hysteresis, as defined by the mechanical properties of the substrate in response to mechanical strain and release of mechanical strain.

In one implementation, a fluidic cavity may be utilized to implement a touch sensor. For instance, as shown in the simplified block diagram of FIG. 1A, a touch sensor may be implemented using one or more fluidic cavities (e.g., 105a-c). A sensor block 100 may be provided that includes one or more data processing apparatus (e.g., 110), computer readable storage devices (e.g., 115), and one or more other elements (e.g., 120, 125) implemented at least in part in hardware circuitry (and potentially also more advanced software- or firmware-based logic 130) to implement functionality associated with a touch sensor. Such touch sensors may be implemented in a variety of applications, which may advantageously make use of the flexible and stretchable fluidic cavities used to implement the touch sensor(s). For instance, the fluidic cavities 105a-c may be woven into an article such as a garment, wallpaper, the outer covering a ball, upholstery, art canvas, or other article with other fibers or material to embed touch sensors within the article.

Figure 2A:
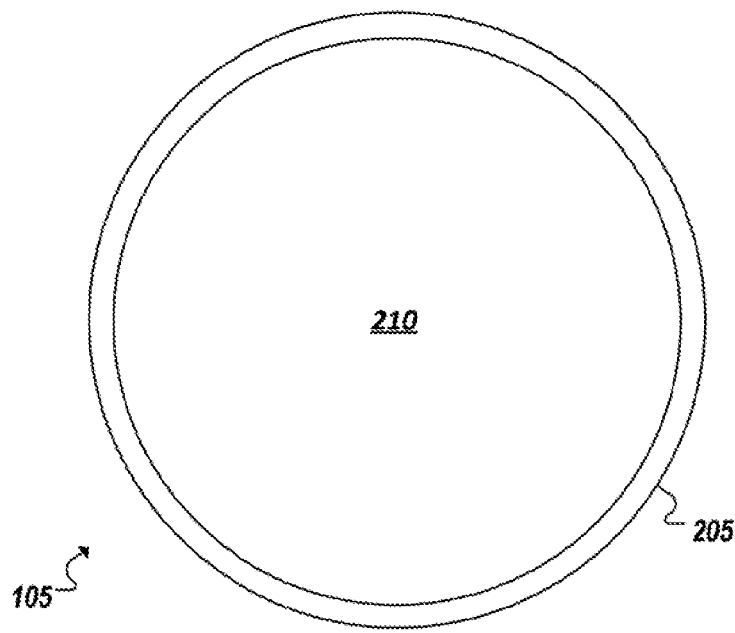
FIGS. 2A-2B are block diagrams illustrating cross-sectional views of an example deformable liquid metal wire.
Figure 2B:
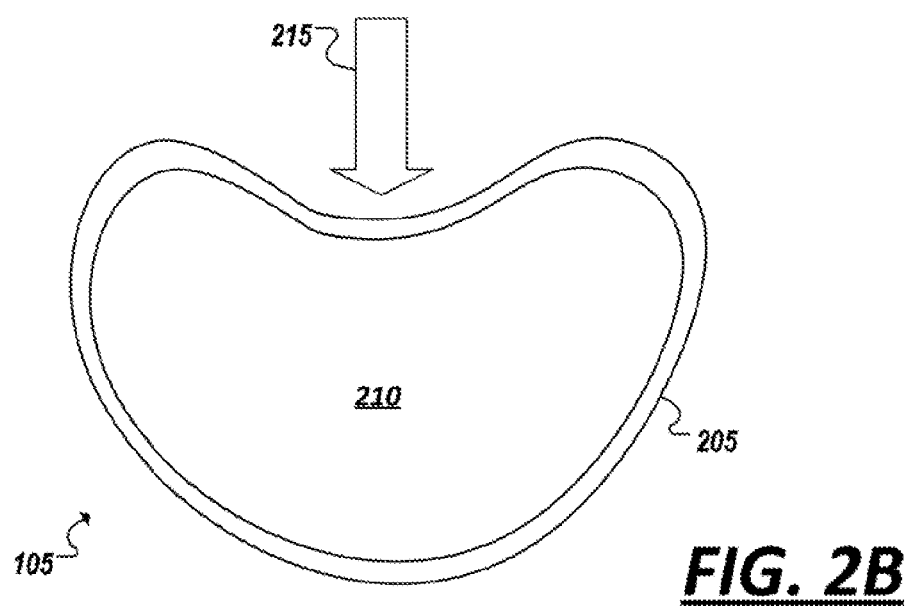

As shown in the example illustrations of FIGS. 2A-2B, the deformable and compressible nature of a fluidic wire may allow for it to be depressed. For instance, FIG. 2A represents a cross-section of an example fluidic wire 105 including a capillary cover 205 encapsulating liquid metal 210. In FIG. 2A, the fluidic wire 105 is in its default state, with the liquid metal 210 filling this section of the cover 205 and forming a substantially round cross-section. In other implementations, a non-round cross-section may be realized, for instance using a sheath or capillary cover with a rectangular or other cross-section. FIG. 2B shows the fluidic wire's 105 cross-section when it is depressed by a force exerted (e.g., at 215) on the cover 205. The deformable nature of the fluidic wire allows the cross-section to be temporarily altered in connection with the force 215. In some cases, this depression of the fluidic wire causes some of the liquid metal 210 to be displaced within the cavity, which may temporarily alter the electromagnetic characteristics of the fluidic wire. Once the force 215 ceases to be applied, the reversible deformability (e.g., elasticity) of the fluidic wire (e.g., as provided by the material of the covering 205) may cause the 105 wire to return to its default cross-section (e.g., as shown in FIG. 2A), as well as its default electrical characteristics. It should be appreciated that a metal need not be purely liquid in order to function as the metal within the fluidic wire, only that the metal be compressible within the capillary and advantageously able to at least partial return to its original form. Indeed, any one of a variety of metals may be used as the liquid metal (e.g., 210) within a fluidic wire, including liquid gold, gallium-based alloys, heterogeneous metal solutions, among several other examples.

Returning to the example of FIG. 1A, an example sensor block 100 may provide logic (e.g., 120, 125, 130, etc.) to interpret and drive actions based on touch interactions with fluidic cavities 105-c. For instance, a force may be applied to depress one or more of the fluidic cavities 105a-c and touch detection circuitry or other logic 120 may detect that the depression is to be interpreted as a touch interaction. Such touch interactions may be the result of a human hand or finger depressing one or more of the cavities 105a-c, may be the result of an impact with another physical body causing one or more of the cavities 105a-c to be compressed, among other examples. In some instances, touch events or interactions may be defined to meet certain characteristics, such as the duration of the depression of one or more of the cavities 105a-c, intensity of the depression (e.g., representing the degree to which the cavity was compressed), a specific combination of two or more cavities being depressed concurrently or in succession, a pattern of touches, among other examples. The compression or depression of any individual cavity (e.g., 105a-c) may be detected, in some examples, by circuitry or logic in detection logic 120 that detects a change in the electrical characteristics of the cavity (or multiple cavities). For instance, a change in impedance of the cavity be detected and may be due to the temporary deformation of the cavity resulting from a touch instance. In some implementations, machine learning may be utilized to define (and potentially also adjust the logic (e.g., 120, 125) used in connection with fluidic-cavity-based touch sensors) parameters for identifying when characteristics measured at the sensor should be interpreted as a touch or even a particular type of touch (of potentially many different touch types), among other example implementations.

A touch sensor may include additional logic to not only interpret various touch events, but to cause other actions in response to a corresponding touch event. For instance, logic 130 may be provided to realize any one of a variety of services. For instance, touch events may be stored and processed by logic 130 to provide biofeedback (e.g., in an athletic garment incorporating the touch sensor), register an event (e.g., a ball incorporating the touch sensor striking a surface, a user sitting on a seat that incorporates the touch sensor, etc.), or drive other software and/or hardware components (e.g., through actuator logic 125) to generate data describing the detected events (e.g., for storage in memory 115), cause other actions and provide services that use touch sensor events as inputs, among other examples.

Figure 1B:
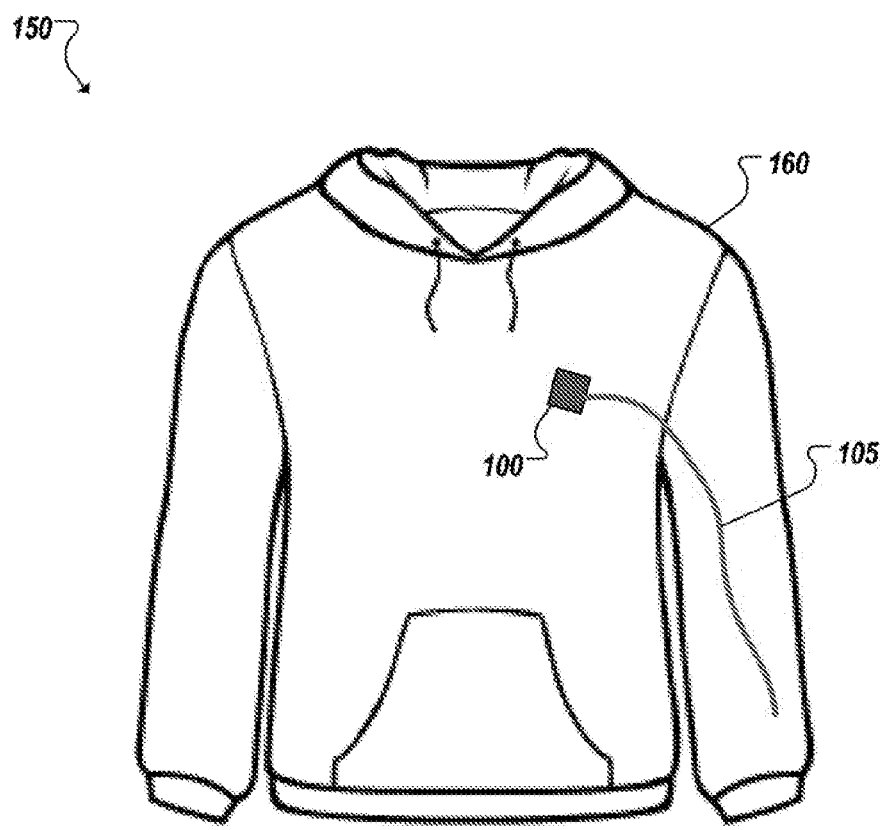
FIG. 1B illustrates a simplified diagram of an example wearable device including a liquid metal touch sensor.

The elastic and flexible nature of fluidic cavities may allow the fluidic cavities to be integrated into a variety of applications where solid metal wires or conventional sensors may be suboptimal. For instance, some devices may be integrated in, come in regular contact with, or be carried or worn in such a way that the device (and the wires interconnecting the components of the device) is regularly compressed, folded, bent, twisted, bounced, etc. As but one example of such an article, wearable devices may be provided, which are to be worn or carried by a human, animal, robot, etc. Such wearable devices may utilize fluidic wires to carry power and/or signals within the device (and even out from the device to peripheral devices or components which may be attached to the wearable device). For instance, as shown in the simplified illustration 150 of FIG. 1B, a simplified diagram 150 is shown to illustrate an example wearable garment 160 to which one or more electronic components (e.g., 100) have been attached (e.g., adhered, interwoven, sewn, clipped, or otherwise attached). For instance, in this example, a fluidic wire 105 may be utilized to connect to a controller component 100 and form a touch sensor. A user, in this example, may depress the sleeve of the garment 160 to cause one or more fluidic wires (e.g., 105) to be depressed and cause a touch event to be registered at the controller component 100, which may cause the controller to generate data and/or actuate other components or actions provided for on the garment. In some examples, the fluidic wire may be integrated, adhered, interwoven, or otherwise connected to the fabric of the garment 160 itself. A variety of other articles may be composed of components utilizing fluidic wires other than touch sensors, such as a fluidic wire used as an antennae, as connective links to other components, among other examples, including combinations of the foregoing.

In one example, as represented in FIG. 3, a touch sensor device implemented using fluidic wire 105 may incorporate an impedance measurement (e.g., 305) into stretchable liquid metal wires for use as a switch or input for devices implementing the touch sensor (e.g., controlling volume or phone operations from headphone wires that use liquid metal wires, with the control being embedded in the wire itself through the touch sensor). Due to the liquid metal wires being conductive, with the liquid metal placed either in adjacent lumens within the same wire or multiple wires attached to form a single wire, it has an inherent electrical impedance. Since liquid metal is not solid, as in other electrical wires on the market, the wire can be stretched, pressed, etc. By applying physical pressure anywhere along the wire, the shape of the lumen or cavity that contains the liquid metal changes and/or the distance from one cavity to another changes.

This change can be measured as a change in impedance from one side of the wire, and can be measured as a change in capacitance, resistance, and/or inductance. This measurement can be accomplished through voltage or current meters, following any method for measuring impedance of an electrical circuit. For example, to measure a change in resistance, an electrical current can be applied (e.g., using source 310) to a wire 105, and an increase in resistance due to physical pressure can be measured (at 305) as a change in voltage across the wire.

Figure 4A:
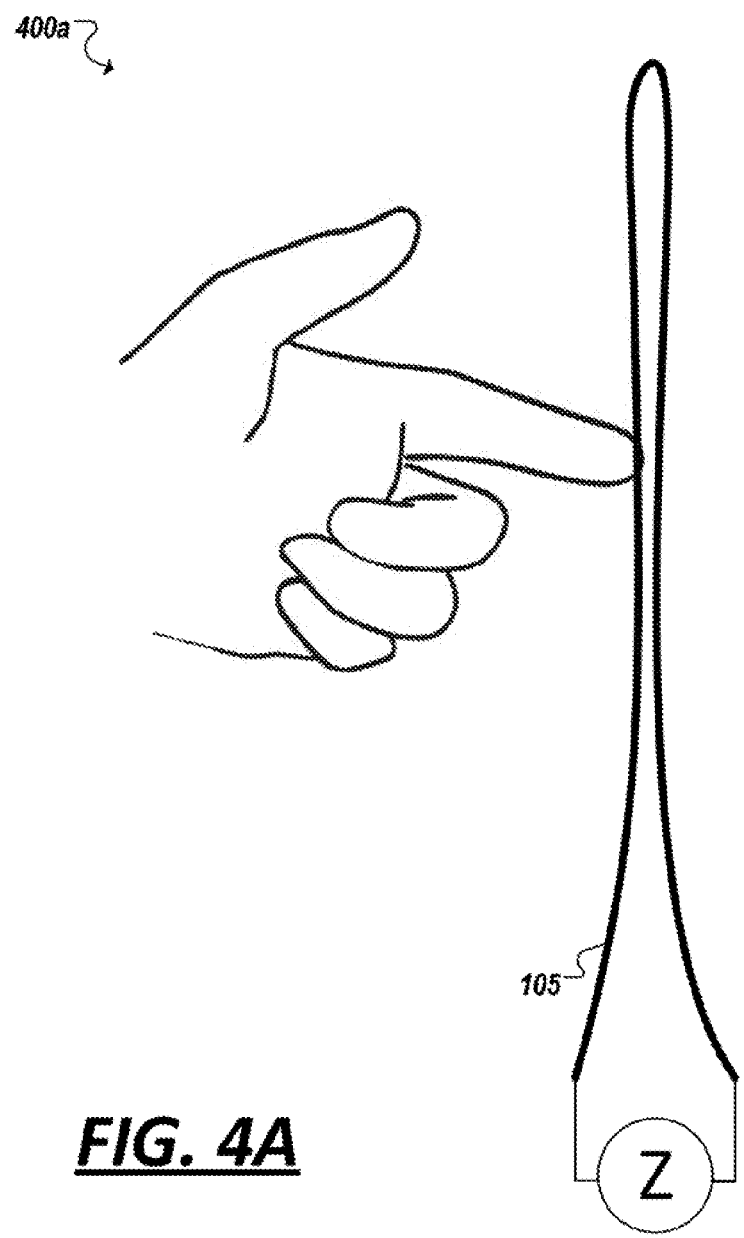
FIG. 4A illustrates a simplified block diagram of an example touch sensor implemented using a liquid metal wire.
Figure 4B:
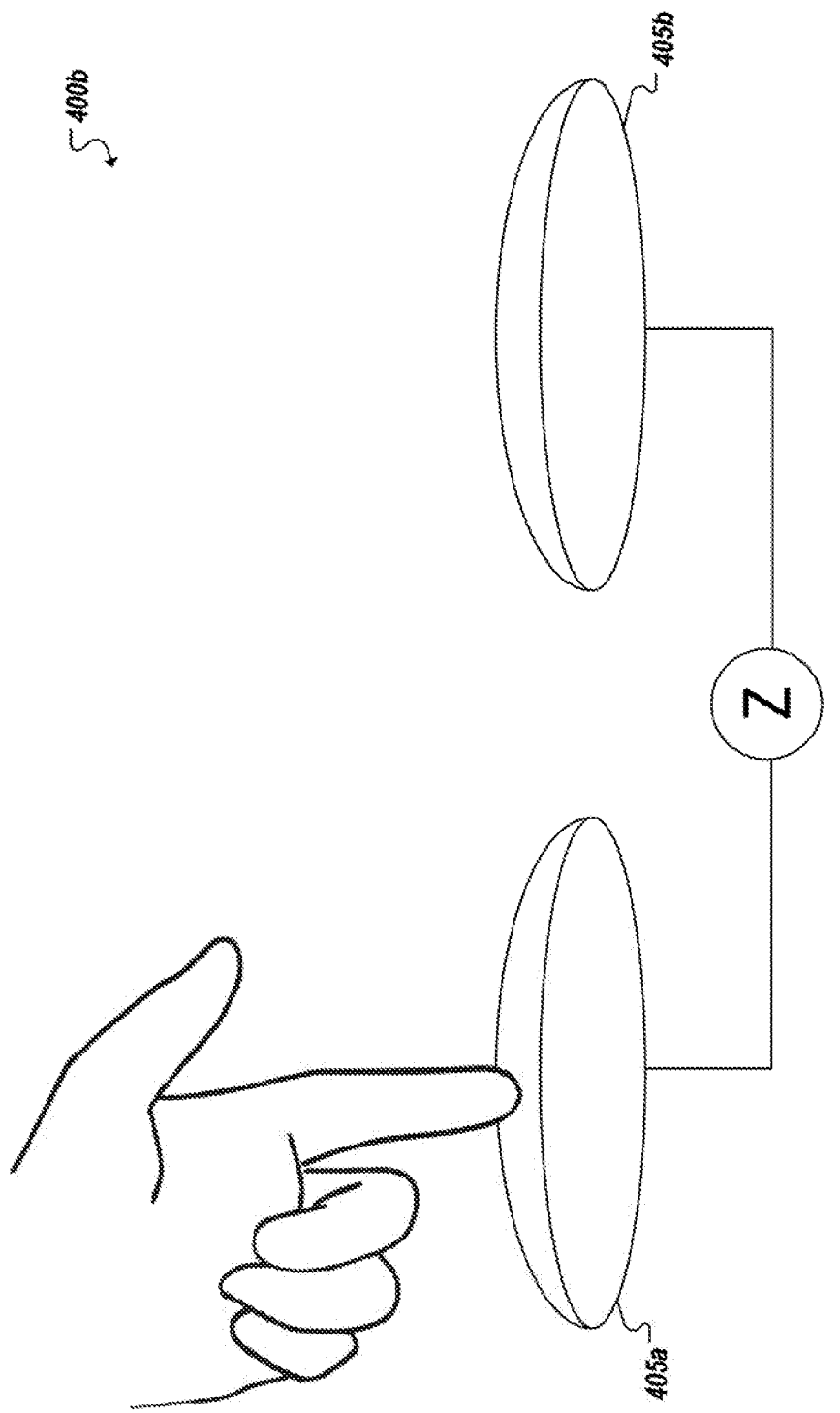
FIG. 4B illustrates a simplified block diagram of an example touch sensor implemented using a liquid metal-filled bubble.

Another example, represented in simplified block diagram 400a of FIG. 4A, may provide for touch events to be measured (at least in part) through measuring a change in capacitance, based on a touch event. For instance, two wires or even a single wire 105 (as shown in FIG. 4A) may be positioned within an article to form two substantially adjacent wire segments. Any electrical characteristics (e.g., resistance, capacitance, inductance) contributing to the impedance Z measure on or between two liquid metal cavities may be measured. For instance, capacitance of the wire(s) may be measured, for instance, by applying a pulsing voltage waveform to the wire or lumen within the wire, and computing the capacitance between it and the adjacent wire segment (e.g., by measuring the time constant). In addition, using the example of FIG. 4A as an example, the termination of the wire on the side not being directly measured may potentially have any impedance load, allowing for zero impedance and treating adjacent liquid metal fibers as parallel-plate capacitors, infinite impedance and treating the liquid metal fibers as a single fiber that varies resistance and inductance when pressed or oriented differently, or a more complex load in between, among other examples. As shown in the simplified block diagram 400b of FIG. 4B, non-wire implementations of a liquid metal cavity (e.g., 405a-b) may be utilized in some embodiments, and inductance (or simply capacitance, resistance, or inductance) may be measured between the cavities 405a-b to detect a touch event occurring at one of the cavities (e.g., 405a). As shown in the example of FIG. 4B, two bubble or blister liquid metal cavities 405a-b may be attached to a substrate and circuitry may be provided to provide a voltage to each cavity. Further, circuitry may be provided to measure electrical characteristics of the circuit to detect a change to the electrical characteristics attributable to a touch event. For instance, touching bubble 405a may cause the bubble to be depressed, temporarily changing the dimensions of the bubble 405a and affecting the capacitance (and thereby the impedance) measured between the two bubbles 405a-b (resulting in a different measurement than would be observed if neither bubble 405a-b were depressed. In still other examples, heterogeneous cavity types may be paired in some touch sensor implementations, such as using a liquid metal wire and a liquid metal blister and measuring impedance, capacitance, and other electrical characteristics between the two liquid metal cavities, among other examples.

Figure 5A:
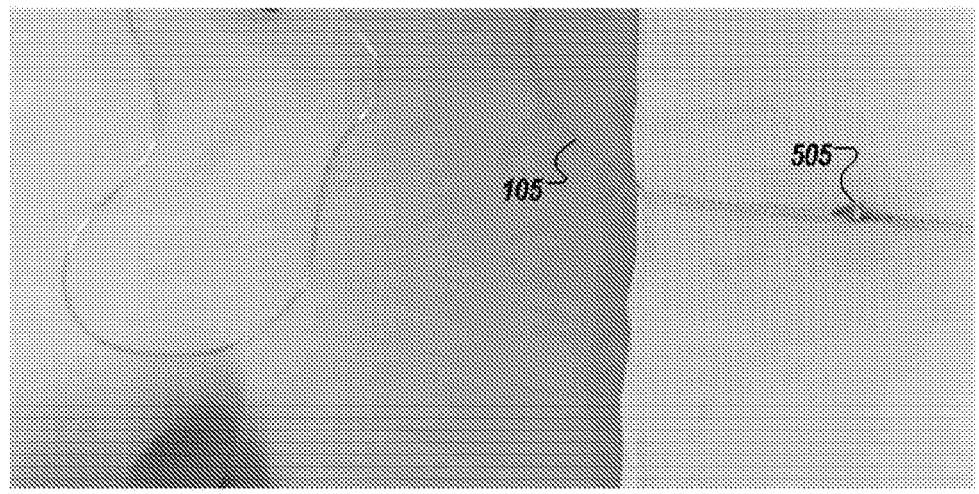
FIGS. 5A-5B are photographs of a first example touch sensor implemented using one or more liquid metal wires.
Figure 5B:
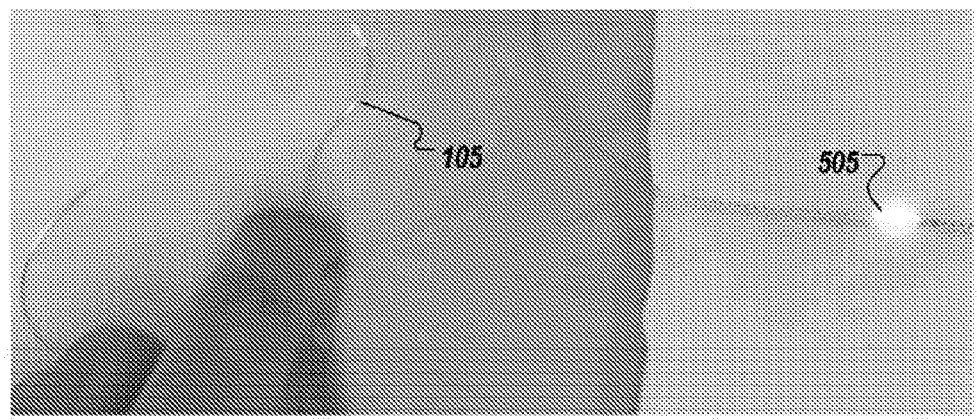
Figure 5C:
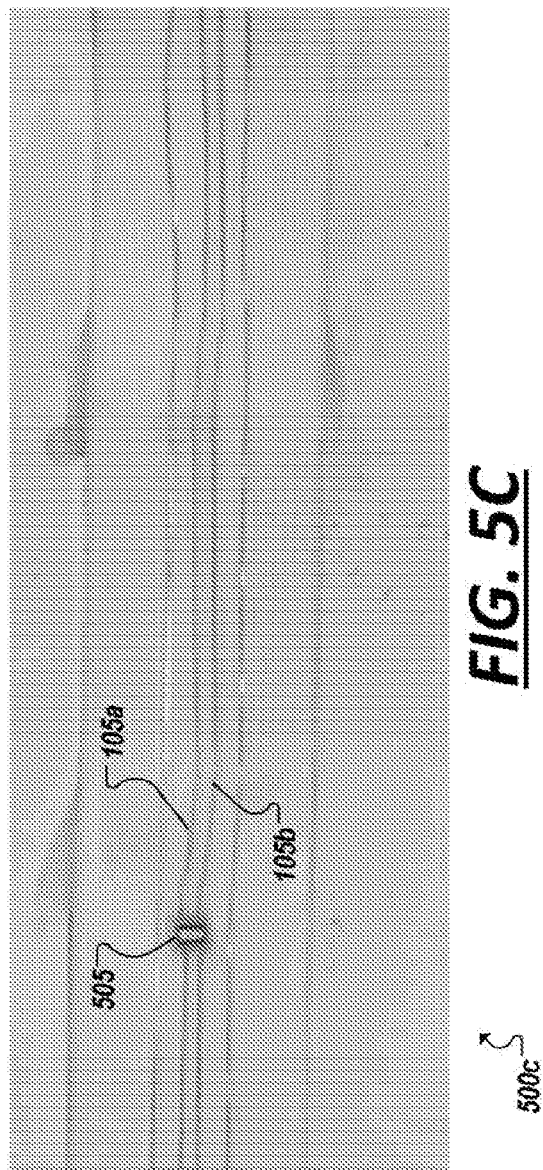
FIGS. 5C-5D are photographs of a first example touch sensor implemented using one or more liquid metal wires.
Figure 5D:
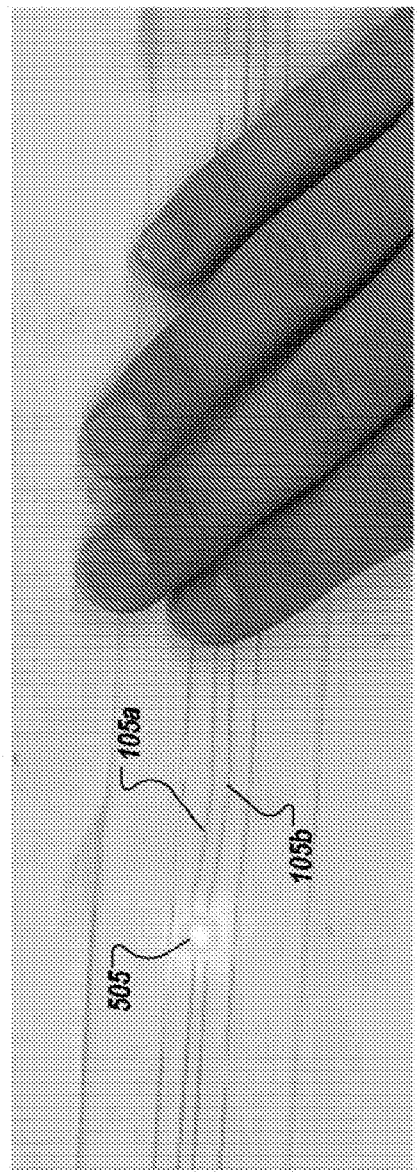

FIGS. 5A-5B are photographs illustrating an example implementation of a fluidic wire touch sensor. As shown in FIG. 5A, a fluidic wire 105 is provided to act as a touch sensor to activate a light emitting diode (LED) 505. When a section of the fluidic wire is depressed (e.g., by a human finger, as shown in FIG. 5B) a change in the electrical characteristics of the fluidic wire may be detected to cause the LED to illuminate. Note that the wire may be depressed at any point along its length to potentially cause the LED to illuminate. In like manner, touch sensors and touch arrays may be implemented using one or more fluidic wires to enable a touch control that does not necessarily require a precise touch event (e.g., the touch of a specific button or touch pad region). In other implementations, such as described below in the example of FIG. 6, a mesh, weave, or other collection of wires may be provided and oriented to provide more complex touch interfaces. Further, as shown in the photographs 500c-d of FIGS. 5C-5D, the individual fluidic wires (e.g., 105a-b) may be woven, adhered, or otherwise attached to a substrate, such as fabric or another material in various applications. Pressing one or both of the fluidic wires 105a-b, may actuate an LED 505 (or other device, depending on the application), as in the example of FIGS. 5A-5B, among other example implementations.

Figure 6:
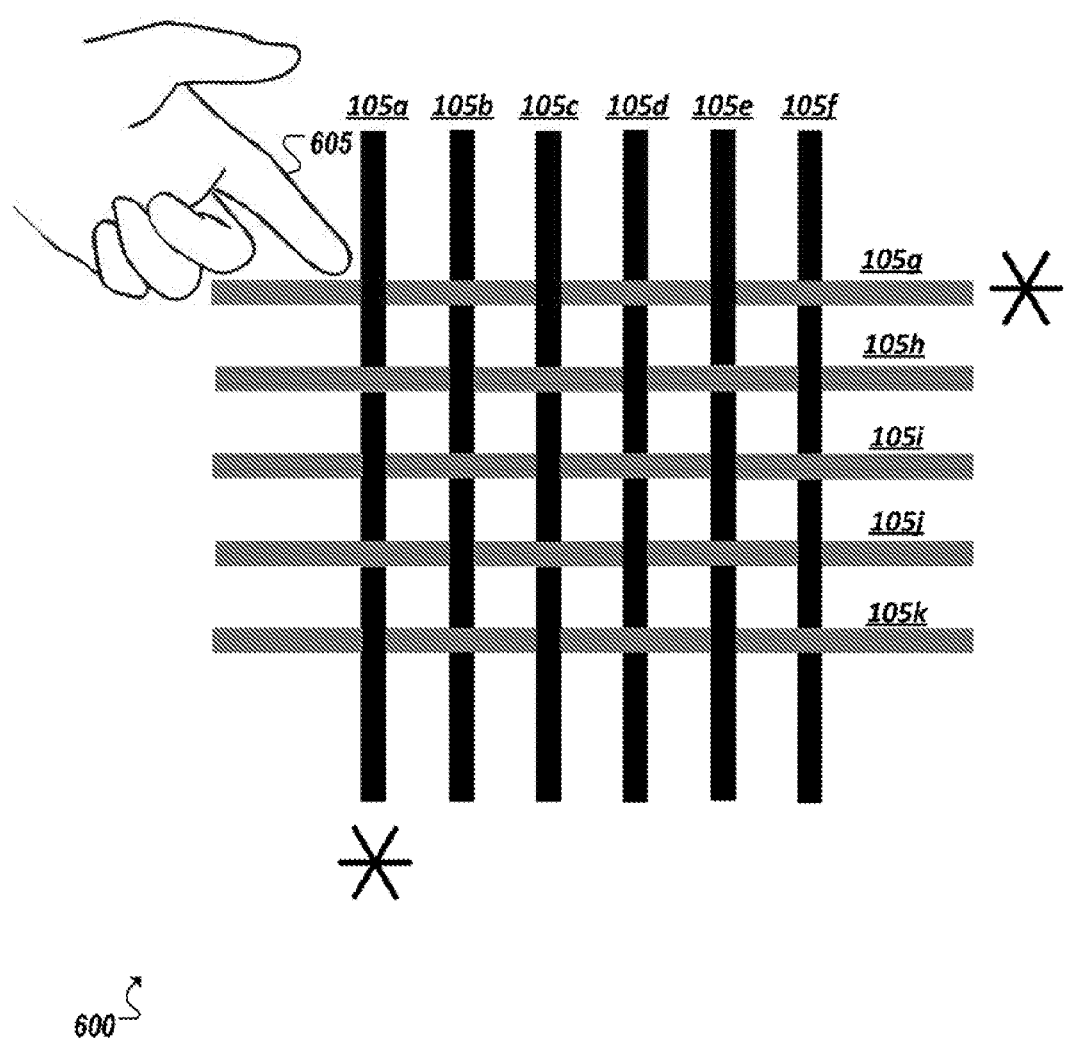
FIG. 6 illustrates a simplified schematic diagram of another implementation of a liquid metal wire touch sensor system.

As shown in the particular example of FIG. 6, in some implementations, a combination of multiple fluidic wires (e.g., 105a-k) may be utilized within a single article to provide a variety of different possible touch combinations and corresponding information relating to these touch events. For instance, in the example of FIG. 6, a grid pattern may be implemented in an article with some of the fluidic wires (e.g., 105a-f) in a first orientation and the remaining fluidic wires (e.g., 105g-k) in another (e.g., substantially orthogonal) orientation. As shown in the example of FIG. 6, a touch event (e.g., 605) may cause two or more wires (e.g., 105a and 105g) to be depressed concurrently or close together in sequence, allowing the position of the touch (e.g., in an x- and y-plane) to be more precisely located. In some cases, touches between adjacent parallel wires (in either the x- or y-direction) may also be measured, for instance, due the touch affecting a capacitance measurement between the two fluidic wires, to allow these touches to also be registered.

Multi-fluidic wire touch arrays may be utilized in a variety of applications. As an example, a touch screen may be implemented in a section of fabric or paper using a collection of fluidic wire touch sensors (such as in FIG. 6) such that multiple different "buttons" may be implemented in this section of fabric or paper. For instance, an array of fluidic wires may be woven into a garment to implement a touch screen on a pant leg, shirt, glove, or other article of clothing. In another example, an array of fluidic wires may be woven into a section of wallpaper or other floor or wall covering, allowing a multi-function, multi-button smart home touch interface to be implemented using the touch sensors. In other instances, other multi-wire sensors may be provided, allowing for various touch locations to be detected (e.g., beyond uniform grid or other patterns). For instance, a variety of fluidic wires may be woven into a garment or artificial muscle allowing for touch instances to be detected at various locations on a user's body, among other example implementations and applications.

As noted above, fluidic wires utilized to register and detect touch events may be connected to a microcontroller or other circuitry to measure and detect changes in resistance, capacitance, inductance, and/or impedance of circuits including the fluidic wires. In some cases, when the change exceeds a particular threshold in scale or time, the microcontroller or other hardware- and/or software-implemented logic may generate a signal to indicate the touch event. Such signals may actuate other devices or components of a system and may be monitored for instance by hardware and or firmware for more advanced analytics, among other example uses. For instance, turning to FIG. 7, a simplified schematic diagram 700 is shown illustrating an example implementation of a touch detection circuit including a liquid metal wire 105 utilized for a touch sensor. The circuit may further include a resistor 705 (e.g., connected to ground 710) to implement a voltage divider, with a microcontroller 100 providing detection logic to detect changes in the voltage measured across the fluidic wire 105 to determine that a corresponding touch event has occurred. The example circuit 700 shown in FIG. 7 may effectively measure the resistance of a fluidic wire. More specifically, in this particular example, the fluidic wire 105 is connected from a constant voltage source to an analog input 715 on a microcontroller. A resistor 705, in this example, may be placed from that same analog input to ground, forming a voltage divider, and the voltage is sampled at this analog input using an analog-to-digital converter circuit at the microcontroller 100. When force is applied to the fluidic wire 105, thereby shrinking the cross-sectional area, the electrical resistance of the fluidic wire 105 increases. This changes the voltage drop across the resistor 705 in this circuit. When a threshold in voltage change is detected, the microcontroller 100 can generate signal to be provided to monitoring logic, trigger an action, among other uses.

Figure 8:
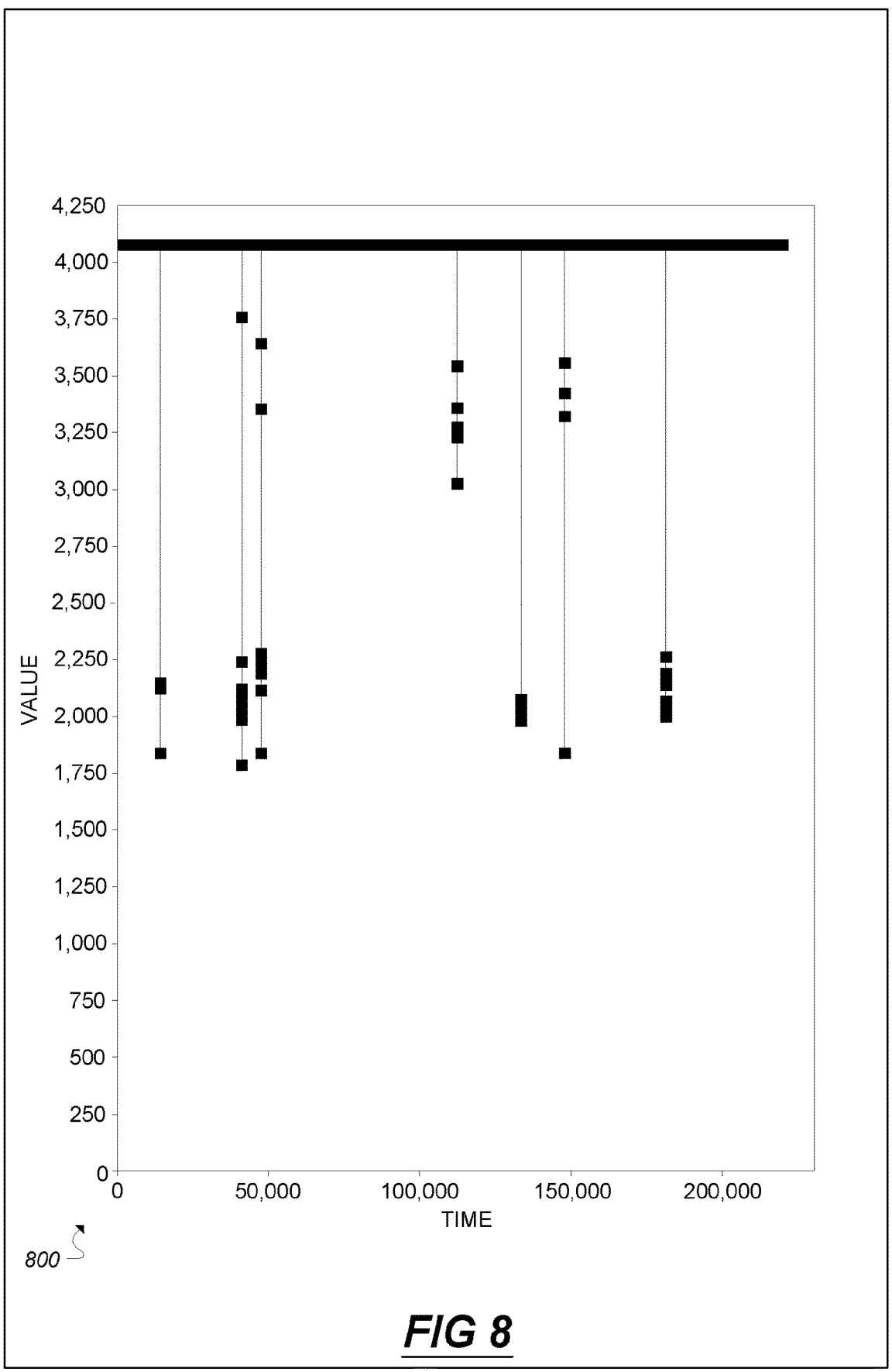
FIG. 8 is a graph illustrating example touches measured using an example touch detection circuit.

Turning to FIG. 8, a plot 800 is illustrated showing a voltage reading from a microcontroller sensing touch events on a fluidic wire. In this case, a constant voltage source is applied to one side of a stretchable liquid metal wire, with the other end being input to an ADC on a microcontroller. The voltage input over time is sampled by the ADC. Whenever the reading drops below a pre-defined threshold (due to a resistance increase from physically pressing the wire), a touch event is detected and an action is executed. For instance, as shown in the examples of FIGS. 5A-5D, an LED may be turned on in response to detecting a touch event. The plot of FIG. 8 shows a plot of the ADC reading over time, clearly showing a drop in the reading every time the wire is pressed.

Figure 7:
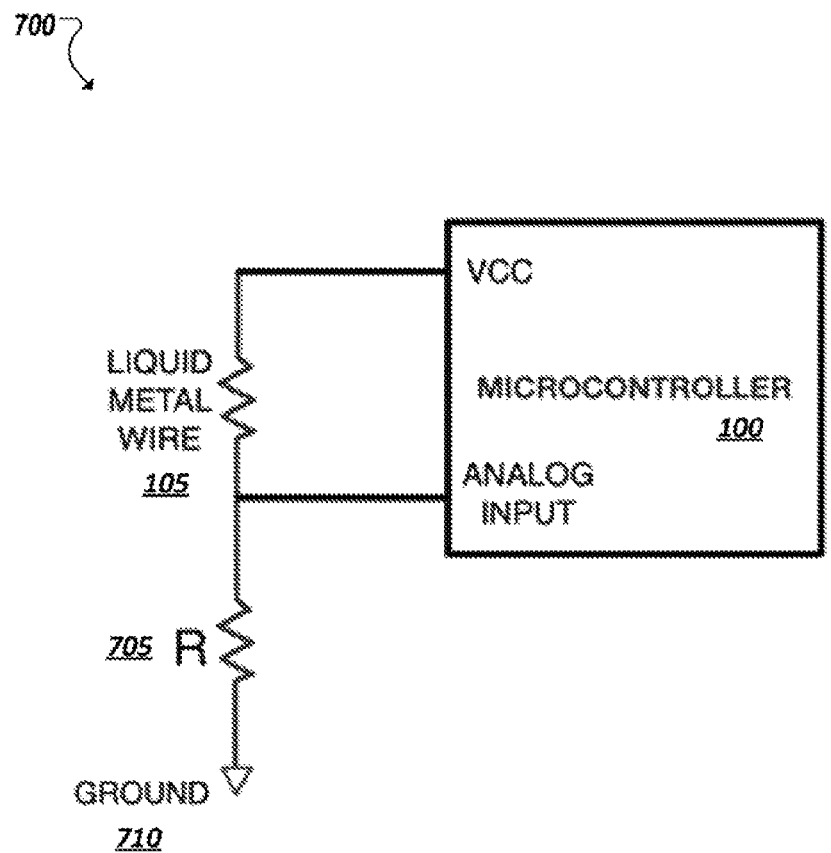
FIG. 7 illustrates a simplified schematic diagram of an example touch detection circuit.
Figure 9A:
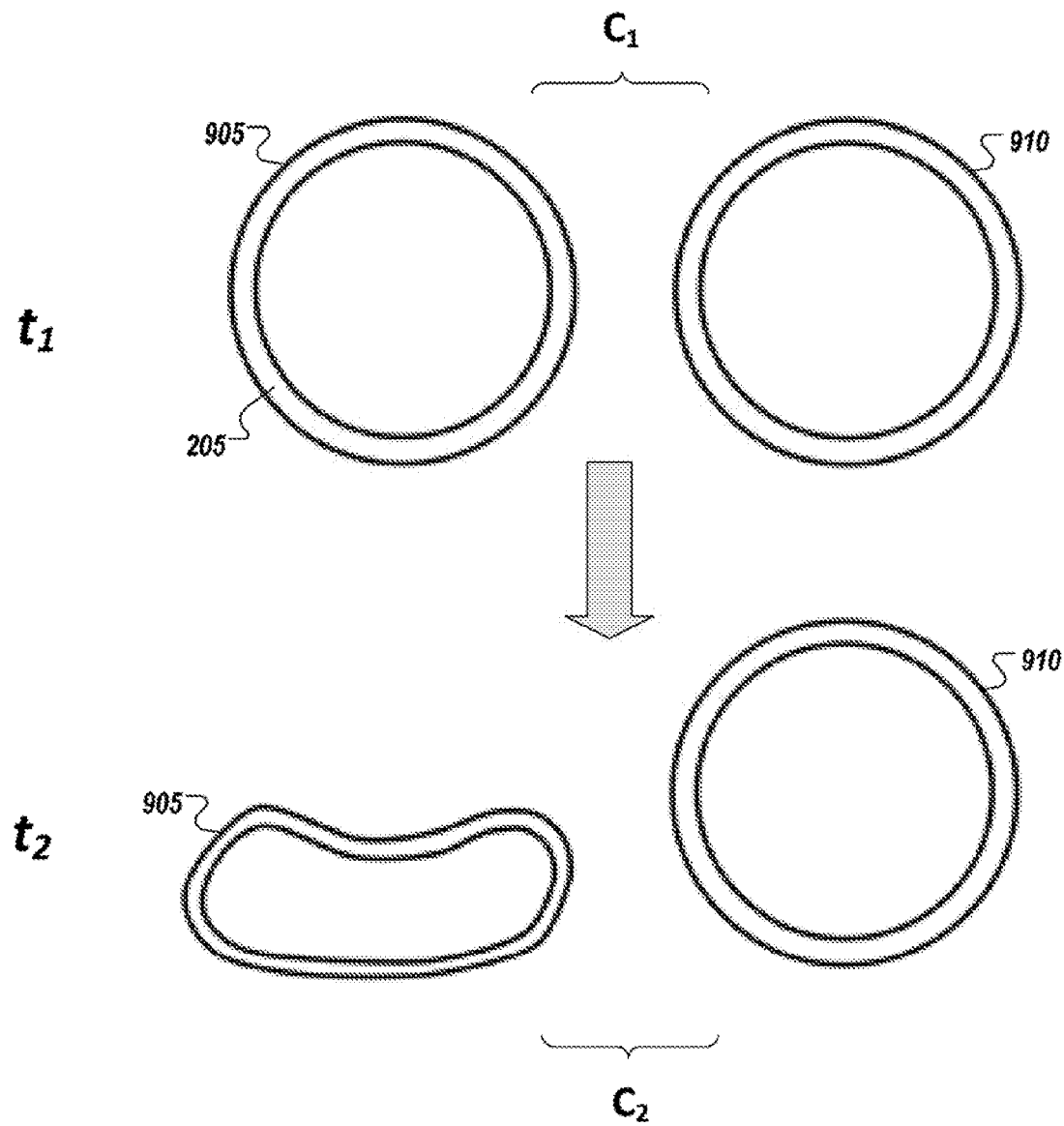
FIG. 9A is a simplified block diagram illustrating use of an example touch sensor implemented using one or more liquid metal wires.
Figure 9B:
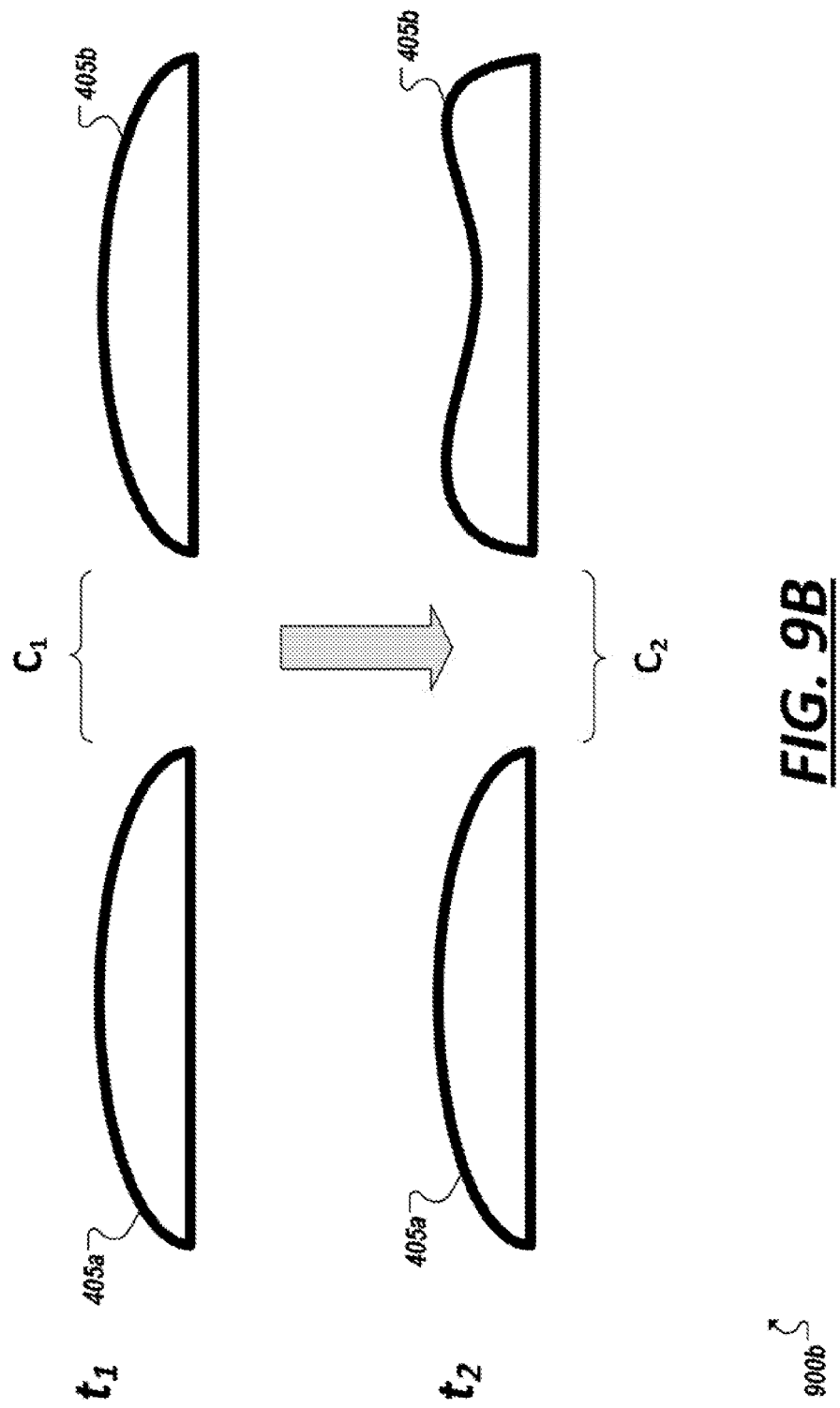
FIG. 9B is a simplified block diagram illustrating use of an example touch sensor implemented using one or more liquid metal bubbles.

While the example of FIG. 7 illustrated the measurement of resistance changes caused from depression of an example fluidic wire touch sensor, other characteristics may additionally or alternatively measured to be used as the basis for determining a touch event. For instance, as shown in the simplified block diagrams 900a-b of FIGS. 9A-9B, capacitance may be measured between two liquid metal cavities. For instance, in the example of FIG. 9A, two cross-sectional views are shown of portions 905, 910 of one or more fluidic wires which are placed in proximity to each other such that an electrical field may be measured between the wires 905, 910. These views may be of portions of the same fluidic wire or of two separate fluidic wires. When directed pressure is not applied to the portions 905, 910 of the fluidic wire(s) (e.g., at time $t_1$) the portions may maintain a particular geometry consistent with the geometry of the capillary covering (e.g., 205) of the wire (which may be round, as in the example of FIG. 9A, or of another cross-sectional geometry (e.g., square, rectangular, triangular, hexagonal, irregular, etc.)). Capacitance (e.g., $C_1$) may be measured between the two portion 905, 910 of fluidic wire, representing the inherent capacitance $C_1$ of the circuit (i.e., when no touch is occurring). As further illustrated in FIG. 9A, if one or both of the fluidic wire sections (e.g., 905, 910) are pressed (e.g., as shown at time $t_2$, when fluidic wire section 905 is pressed), the cross-sectional area of the pressed wire section is changed, as well as potentially the distance between the fluidic wire sections and the dielectric between them, resulting in a change in capacitance (e.g., $C_2$) measured between the two fluidic wire sections 905, 910 at time $t_2$. Indeed, in some implementations, a change in capacitance may even be caused by a touch (e.g., a finger) positioned between the wire (or other cavity) sections, due to the change in the dielectric caused by the foreign object. Similar principles may be applied to non-wire fluidic cavity implementations, such as shown in FIG. 9B, where capacitance changes may be measured between two blister or bubble liquid metal cavities (e.g., between cavities 405a-b, with a change being detected based on the depression of cavity 405b at time $t_2$), among other examples.

Figure 10:
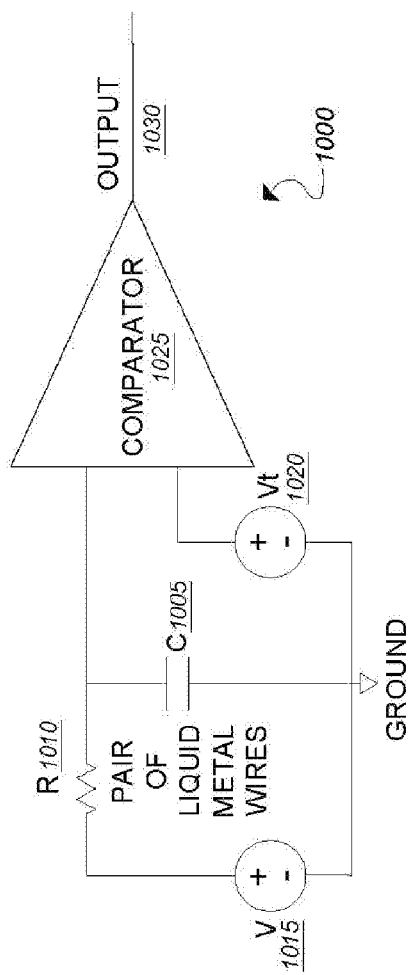
FIG. 10 illustrates a simplified schematic diagram of an example touch detection circuit.
Figure 11:
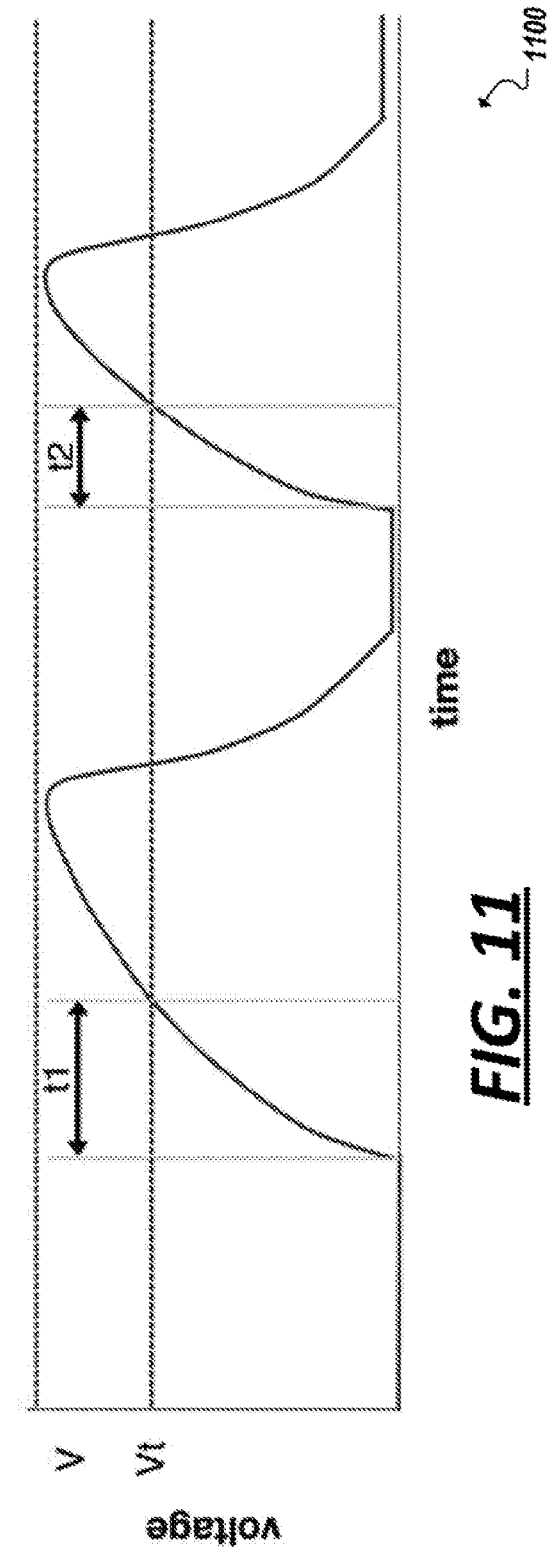
FIG. 11 is a graph illustrating example touches measured using an example touch detection circuit.

FIG. 10 is a simplified schematic diagram 1000 illustrating an example implementation of a circuit to measure changes in capacitance between sections of fluidic wire utilized to implement a touch sensor. The example capacitance meter circuit may be implemented, for instance in a microcontroller connected to and the fluidic wire(s). In this implementation, the capacitance between sections of fluidic wire may be found by measuring the time it takes for the capacitor (formed by the two or more sections of fluidic wire) to charge, defined as the time constant. The time constant (TC) is proportional to the capacitance (TC=R*C), and can therefore be used to compute the capacitance. In the circuit in this diagram, a pair of sections of fluidic wire is represented as a capacitor 1005. A resistor 1010 may be placed in series, and a voltage source (V) 1015 is applied across this RC circuit in order to charge the fluidic wire capacitor. The voltage Vc measured across the capacitor 1005 is compared with a constant voltage source (Vt) 1020 using a comparator circuit 1025. In this example, when a touch event causes the voltage Vc to pass Vt, the comparator 1025 may generate a signal at its output 1030 indicating a touch event. In such implementations, the comparison can be either analog (using an analog comparator to detect when one signal has a higher magnitude than the other), or digital (using an ADC to sample the voltage across the capacitor and detect when it passes the specified threshold). As shown in the graph 1100 illustrated in FIG. 11, the time constant can then be computed as the difference in time from when the voltage source (V) was applied to the RC circuit, and when this voltage passed Vt. The capacitor is then discharged. This process may be repeated, and the capacitance for each successive recorded time constant may be recorded with the previous recording in order to detect a change in capacitive due to touching or pressing of the fluidic wires measured in the system.

Figure 12:
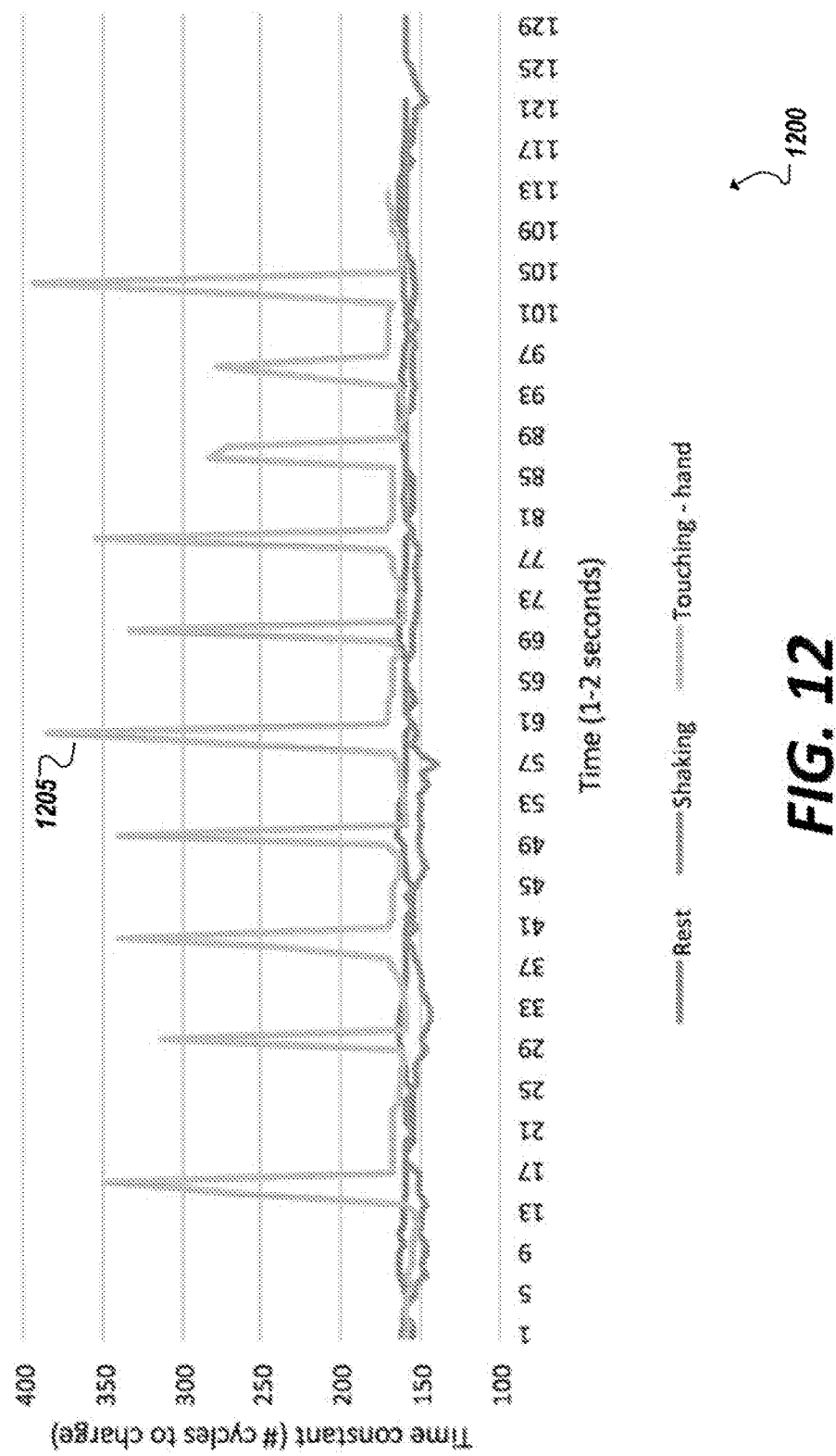
FIG. 12 is a graph illustrating measuring touches and movements measured using an example touch detection circuit.

FIG. 12 illustrates a graph 1200 illustrating the measuring of capacitance between two or more sections of fluidic wire in connection with observed activities involving a garment in which the fluidic wire is woven as a fiber of the garment. In this particular example, a microcontroller with a built-in analog comparator is used. A general purpose input/output pin is used to supply the voltage V (using a 3V source) for charging the fluidic wire capacitor, and triggered to ground for discharging the capacitor. A timer was used to count the number of clock cycles from the time the voltage V was applied and when Vc passed Vt (using a constant 2V source). The plot in FIG. 12 shows results of the recorded time constant over time using this implementation applied to a pair of liquid metal wires that had been knitted into fabric (e.g., as in FIGS. 5C-5D). The plot includes the fabric at rest (without touching the fibers), when the fibers are touched repeatedly (noted by the peaks (e.g., 1205)), and when the fabric is being shaken (showing that incidental movement does not trigger a touch).

It should be appreciated that fluidic wire-based touch sensors may be utilize in a variety of diverse applications. In some cases, the fluidic wires being used may double as the signal or power wires being used in the wire's application (e.g., a speaker wire for a set of headphones), while also serving as a touch control for the application. In other cases, additional lumens or fluidic wires may be added (e.g., in addition to power or signaling wires) for specific use as a switch or other touch sensor. Fluidic wire-based touch sensors can be used in audio or smart phone applications, providing a means to detect physical pressure to execute a command (such as answering a phone or increasing volume). In addition, it can be used to encode specific executions, for example requiring a wire to be physically pressed or squeezed once to perform one action and twice to perform another. One can apply physical pressure at any point along a wire, not being limited to using a physical switch (as is often used in audio players or smart phones). The wire of an electronic device itself can serve as the physical pressure sensor.

Additionally, fluidic wire-based touch sensors can be used in textile applications. Due to the shape-changing intrinsic properties of the liquid metal devices being used as the physical pressure sensor (in addition to their use as interconnects for signal transmission within an electronic device), they are easily incorporated into textiles for power or data transmission to electronics (such as lighting, heating, fitness tracking, or audio devices) in clothing and other accessories (such as heated gloves or lighted athletic apparel). In such an application, wires for sensing can be woven as a single or parallel set of wires, allowing the impedance between any set of arbitrary wires to be measured and used for performing an action within a circuit. Using a mesh of liquid metal wires woven into the fabric or attached to the surface, impedance change due to shape deformation of adjacent wires or wires placed on top of each other can be measured. For example, this could be used in a shirt to detect if one is touching one body part vs. another, and execute different tasks based on the location of the applied pressure.

These points for fitness apparel may also be applied to medical devices. For example, incorporating stretchable liquid metal wires into a tight-fitting shirt or chest band can be used to detect breathing for inductive plethysmography devices, or for monitoring heart rate, by detecting the change in impedance due to the stretch of the wire that results from breathing or heart beating. In some instances, such vibrations can be also detected wirelessly through the same principle of the RADAR: using an external antenna that emits radiation, the vibrations and shape variations of the liquid metal fibers change the resonant frequency of the fiber and therefore they can be detected by the same external antenna.

The orientation of the wires can be set to enhance the measurement, or to help detect the location of the physically applied pressure. This is applicable whether reusing the wires being used for signal or power transmission, or through the addition of wires specifically for this switching application. In some implementations, fluidic wire-based touch sensors may be utilized to cause signaling to another computing device (e.g., a smartphone or IoT system). In some cases, signaling may be provided by a fluidic wire-based antenna, such as utilizing features described in U.S. Pat. No. 8,587,493 (incorporated by reference herein), among other examples.

An interface or connector may be provided to connect liquid metal wires used in touch sensor applications, with other circuitry and logic (e.g., used to implement these touch sensors). In such devices, the liquid metal, such as liquid Gallium or alloys thereof, may be used as a current-carrying medium for transporting data and/or power. To use these devices with external electronics, an interface between the liquid metal and solid conductor leads of the external devices is required. This poses significant challenges in ensuring consistent electrical continuity between the external electronics and liquid metal device, filling the devices with the liquid metal, and sealing the connection point to ensure the liquid metal will not leak.

To address the concerns above, a device, or connector, may be provided to serve as an interface between the liquid metal and the electrical connector, or other external electronic devices having channels housing liquid metal. A conductive surface lines any amount of the inner surface of the channels, which extends outside the channel, allowing it to be accessed by external processes to form electrical connections from an external device to the liquid metal inside. The channels have opening(s) for connecting to liquid-metal devices. This allows for conductive liquid metal to extend into these channels and form an electrical connection with the conductive surface within this device, and therefore make an electrical connection with an external solid electrical connector. An opening may be added to the channels for filling this interfacing device and the liquid metal based devices with liquid metal, allowing for increased control of the filling process, as opposed to filling the devices prior to attaching to external solid contacts.

Figure 13:
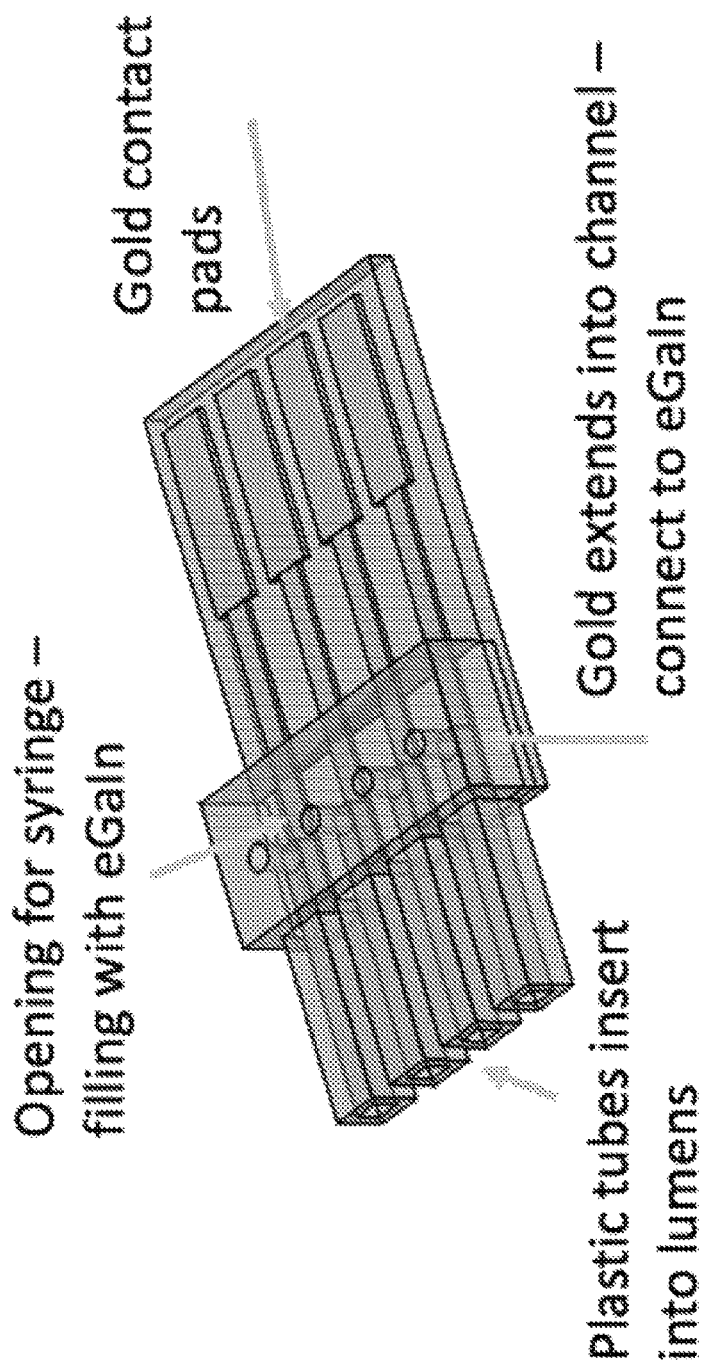
Figure 14:
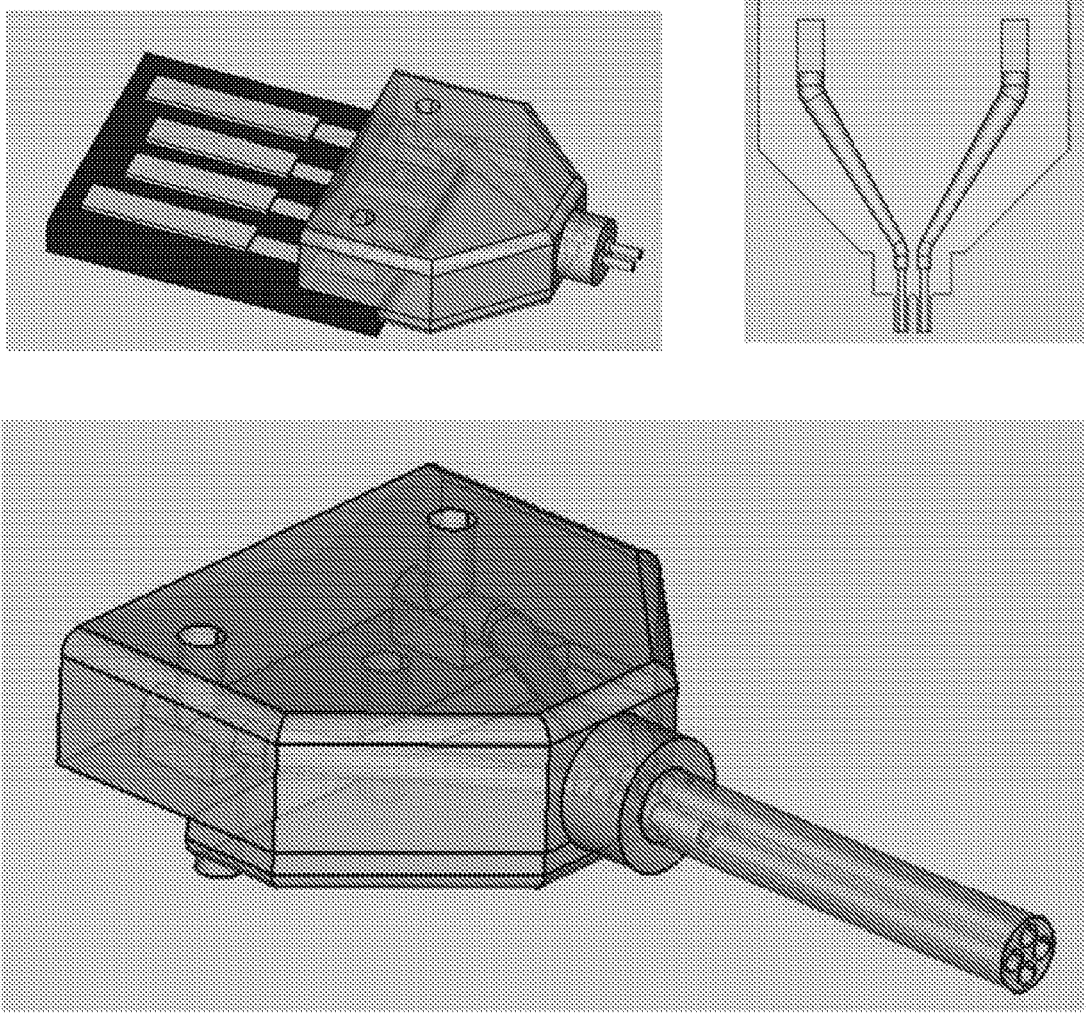
Figure 15:
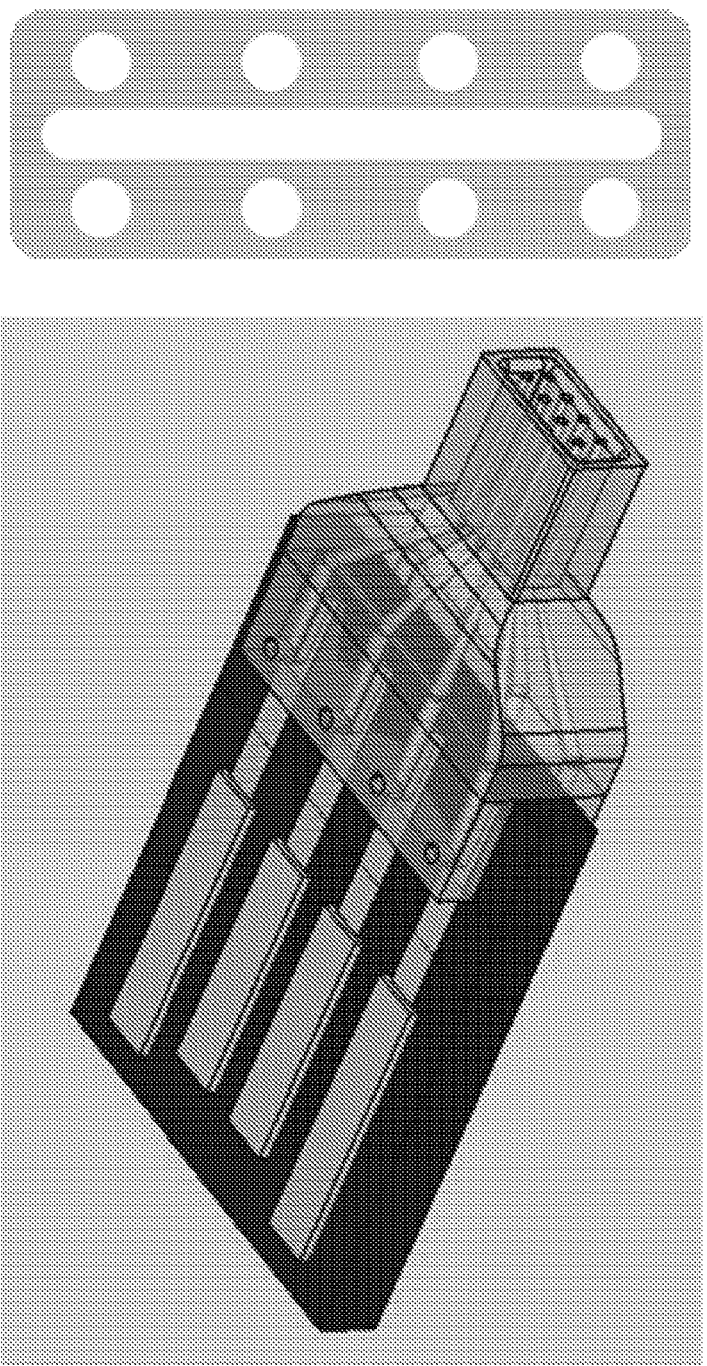

In some implementations, to attach to liquid metal devices, hollow tubes may protrude from the surface. Hollow tubes may refer to any set (single or multiple) of solid or flexible polymer, metal, or other material that are hollow and organized appropriately for fitting into multi-lumen tubing, a single or set of individual tubes, or other devices housing liquid metal, such as terminals for a flexible antenna. Such tubes may have any cross-sectional geometry depending on the specific application (e.g., square as shown in the example of FIG. 13, round as shown in the example of FIGS. 14 and 15, etc.). The individual tubes may be kept a distance apart from each other to separate the individual liquid metal conductors and allow for them to be inserted into the device housing the liquid metal. In some implementations, a surface with openings may be used without having these hollow tubes protruding, allowing for the liquid-metal-housing devices to be sealed against the surface, having the openings in these devices (e.g., tubing, flexible electronics, etc.) line up with the openings on an interfacing or connector device, and sealed using adhesive, UV welding, thermal fusion, solvent bonding, or any other example mechanism for sealing around each opening. This may also allow for devices that have needles or individual tubes to be inserted into this interfacing device or connector. In addition, a sleeve may be placed around this connection point with the liquid metal device in order to add structural integrity, or to limit flexibility or add rigidity (such as illustrated in the example of FIG. 10).

Continuing with the above example, these tubes, or openings, form channels within an interfacing device. These channels can have any geometry, extending the geometry of the liquid metal device it is connecting to (such as illustrated in the example of FIG. 13), or modifying the geometry throughout the channel to match the solid electrical connector it is interfacing with (such as illustrated in the examples of FIGS. 14-15). An opening to the channel allows for filling the channel, and liquid metal device it is attached to, with liquid metal. This opening may then be sealed with adhesive or by bonding a second piece of material that can either match the geometry of the opening or be placed against the surface. This bonding can be accomplished using adhesive, UV welding, thermal fusion, solvent bonding, or any other form of sealing to ensure that liquid metal does not leak out of the device. Additionally, this opening may be kept sufficiently small such that liquid metal is not able to exit, but large enough that a needle can be used to fill the device, serving as an inherent valve.

In some examples, channels may be either constructed of, or lined with (partially or fully) a conductive medium, such as, but not limited to, gold or nickel plating. This conductive contact may extend out of the device, allowing it to be connected to a solid electrical connector. This conductive surface can either be incorporated into the channel, or be part of an external surface, such as a PCB (such as in the examples of FIGS. 14-15). For instance, the channels may have an opening with the walls around this opening being sealed against liquid metal leaking. An opening in the channel allows for the channel to be exposed to the conductive surface rather than lining the channel itself.

In some implementations, an interfacing device, such as described above, may be universal, serving to fill, seal and cap the liquid metal devices, having external leads that can be treated as wire leads from a solid electrical device would be treated. By doing so, it may then be attached to connectors, such as USB, audio, lightening, etc., or to leads on other electrical devices that are available on the market, such as antennas, lighting, etc. Additionally, this device may be used as the connector itself by shaping the external solid conductive contacts into the geometries required by the application, incorporating this interfacing device and contacts of the appropriate connectors into a single electrical connector. Such connectors can expand the applications of liquid metal devices, such as integration in wearables, smart fabric and clothing, plug-and-play sensors and microcontrollers, among many other examples.

An improved interfacing device for use with liquid metal devices may possess example advantages over tradition solutions. For instance, through the use of conductive hollow channels with external solid leads, external electronics may interface with liquid metal filled devices as if they were solid conductors. As another example, the use of channels within such interfacing device allows for the reorganization of different leads from the liquid metal based device. This may be particularly useful for applications in which liquid metal is used in small tubing. The ability to change the channel geometry allows for it to be enlarged, simplifying post-processes for filling and sealing the device with liquid metal. As another example advantage, by using hollow channels and having the ability to inject the liquid metal after sealing a device to a solid external device, higher control over the filling of liquid metal may also achieved. When attempting to interface a liquid metal device with solid electronics using solid conductive pins, or other solid conductors that are inserted into the liquid metal, the pressure and/or volume of liquid metal inside a device can be difficult to control. By having a completely hollow system, which includes an opening for filling without having to insert the electrical contact into the liquid metal device, parameters such as volume or pressure of the liquid metal can be controlled using external filling systems, such as pressure-controlled syringe pumps, without concern for inserting a conductor after filling. Further, the devices described herein may allow for application-specific devices to be designed, with inherent conductivity built into channels for interfacing between the two devices. Additionally, by using hollow channels, liquid metal may be injected into the devices after sealing to the external connectors or other electrical devices. This may avoid the risk of leaking liquid metal during processes for attaching external electronics, among other example advantages.

Figure 16:
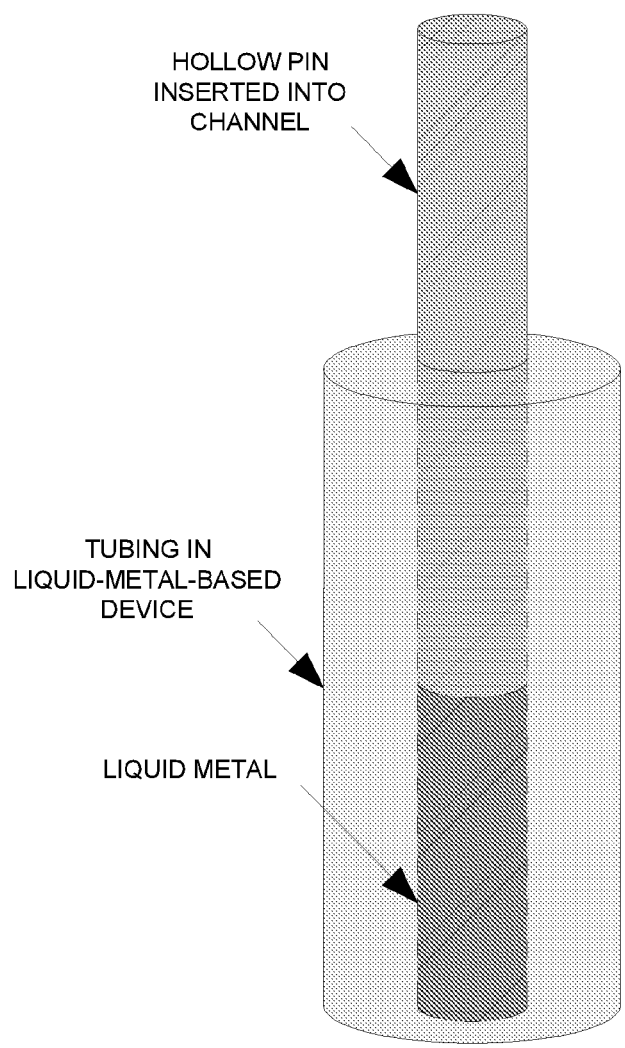
Figure 19:
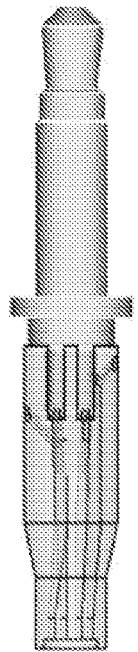
Figure 21:
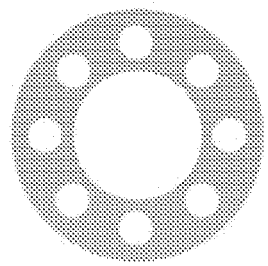
Figure 20:
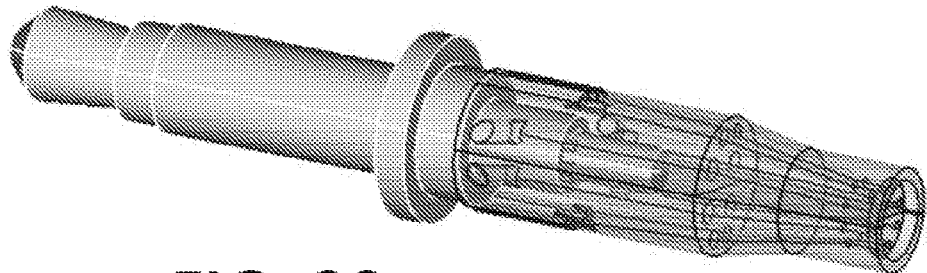

In some implementations, such as illustrated in FIGS. 16-18, hollow metal pins may be used to interface liquid metal wires and electrical connectors. Pins here refer to any hollow tubing, of any geometry (i.e. rectangular, circular, etc. depending on the application), either made of a conductive material or with conductive material on the surface (i.e. stainless steel or copper pins, or tubes made of a non-conductive material such as silicon or a thermoplastic with gold, platinum, etc. plated, sputtered, or otherwise bonded to the surface). The liquid metal can fill one or more lumens within a stretchable wire. The metal pins may be inserted into these terminals or lumens prior to filling, and serve as a check valve, allowing for liquid metal to remain within the wire within being forced out, up to a pre-defined pressure that is decided by the inner diameter of the pin. Further, such pins may serve as an electrical contact, allowing current to pass from one pin, through the liquid metal and through the pin on the other side, interfacing with one or more electrical connectors. Such pins can further ensures electrical contact. By filling the wires with liquid metal through the hollow pins, the pins and wire are filled with liquid metal. This allows for contact of the pin with the liquid metal for the entire length of the pin, and maintains sufficient volume within the wire. Additionally, pins can be used to control filling processes. By attaching pins prior to filling and filling through the pins, not only is electrical contact ensured within the inner walls of the pins, but it allows for a clean filling process by not requiring the filling apparatus to be removed and a solid conductor to be inserted for electrical connection. Additionally, this allows some control over the pressure inside the pins and liquid-metal-based devices. During filling, when a desired pressure or volume is reached, the pins may be crimped or capped, sealing the ends to avoid leaking and maintaining the desired pressure or volume within the device(s). In another example, illustrated in FIGS. 19-21, an audio/video connector can be implemented using the concepts introduced above, to enable liquid metal to be utilized to implement an audio/video wire, among other examples.

In one example implementation, tests of long-term electrical contact within a system as described above were conducted. Hollow gold or stainless steel pins are inserted into either side of thermoplastic elastomer tubing in three samples. Eutectic Gallium Indium (eGaIn) was inserted into the device by encompassing the pin on one side with a syringe tip, and pushing the eGaIn through the pin and the device with a syringe until it was observed exiting the pin on the opposite side. At this point, both pins were crimped and the syringe was removed. Over time, this has showed resistance to leaking and consistent electrical conductivity across the two pins. Interfaces adopted in a system including liquid metal wires, including liquid-metal-wire-based touch sensors may, in some implementations, be according to principles and implementations shown and discussed in PCT Application Ser. No. PCT/US2017/043407, entitled "Fluidic Wire Connectors," which is incorporated by reference herein in its entirety.

Reference throughout this specification to "one implementation" or "an implementation" means that a particular feature, structure, or characteristic described in connection with the implementation is included in at least one implementation of the present invention. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

The following examples pertain to embodiments in accordance with this Specification. Example 1 is a touch sensor including: one or more liquid metal wires and detection logic. The detection logic includes hardware circuitry to: detect a change in an electrical attribute of the one or more liquid metal wires based on a depression of the one or more liquid metal wires; and indicate a touch event corresponding to the depression of the one or more liquid metal wires based on the change in the electrical attribute.

Example 2 may include the subject matter of example 1, where the liquid metal wire includes an insulating elastomeric covering to enclose a liquid metal.

Example 3 may include the subject matter of example 2, where the liquid metal includes a gallium-based metal.

Example 4 may include the subject matter of example 3, where the liquid metal includes eutectic gallium indium (EGaIn).

Example 5 may include the subject matter of any one of examples 1-4, where the one or more liquid metal wires include a plurality of liquid metal wires and the detection logic is further to detect a depression of any individual one of the plurality of liquid metal wires.

Example 6 may include the subject matter of example 5, where the detection logic is further to determine a location of the touch event based on detection of a depression of two or more of the liquid metal wires.

Example 7 may include the subject matter of example 6, where the depression of the two or more liquid metal wires is concurrent.

Example 8 may include the subject matter of example 6, where the depression of the two or more liquid metal wires is in series.

Example 9 may include the subject matter of any one of examples 1-8, where the touch event is further based on an intensity of the detected change.

Example 10 may include the subject matter of any one of examples 1-9, where the touch event is further based on a pattern of depressions of the one or more liquid metal wires.

Example 11 may include the subject matter of any one of examples 1-10, where the touch event is further based on a duration of the depression.

Example 12 may include the subject matter of any one of examples 1-11, where the electrical attribute includes impedance of the one or more liquid metal wires.

Example 13 may include the subject matter of any one of examples 1-12, where the electrical attribute includes inductance of the one or more liquid metal wires.

Example 14 may include the subject matter of any one of examples 1-12, where the electrical attribute includes capacitance of the one or more liquid metal wires.

Example 15 may include the subject matter of any one of examples 13-14, where the one or more liquid metal wires includes a single liquid metal wire.

Example 16 may include the subject matter of any one of examples 1-12, where the hardware circuit includes a voltage divider including the one or more liquid metal wires and the electrical attribute includes a voltage measured at the voltage divider.

Example 17 may include the subject matter of any one of examples 1-16, where the depression is caused by the touch event.

Example 18 is an article including a touch interface including the touch sensor of any one of examples 1-17.

Example 19 may include the subject matter of example 18, where the article includes a garment.

Example 20 may include the subject matter of example 19, where the garment includes an elastomeric athletic garment.

Example 21 may include the subject matter of example 18, where the article includes upholstery.

Example 22 may include the subject matter of example 18, where the article includes wallpaper.

Example 23 may include the subject matter of example 18, where the article includes athletic equipment.

Example 24 may include the subject matter of example 18, where the article includes a medical device.

Example 25 may include the subject matter of example 18, where the article includes a headphone cord.

Example 26 is a flexible sensor including: a single liquid metal wire; a measurement circuit coupled to the liquid metal wire to measure impedance across the liquid metal wire; and detection logic to detect from the measurement circuit a change in the impedance corresponding to a depression of the liquid metal wire by a force.

Example 27 may include the subject matter of example 26, where the liquid metal wire includes a stretchable covering to contain a liquid metal.

Example 28 may include the subject matter of example 27, where the depression compresses a portion of the cross-sectional geometry of the covering corresponding to location of the force.

Example 29 may include the subject matter of example 28, wherein the cross-sectional geometry is one of a rectangular geometry, a triangular geometry, and a hexagonal geometry.

Example 30 may include the subject matter of any one of examples 26-28, further including a resistor connected in series with the liquid metal wire to form a voltage divider, where the measurement circuit is to measure resistance of the liquid metal wire using the voltage divider.

Example 31 may include the subject matter of any one of example 26-30, where the liquid metal wire is attached to a fabric substrate.

Example 32 may include the subject matter of example 31, where the liquid metal wire is interwoven into the fabric substrate.

Example 33 may include the subject matter of any one of example 31-32, where the fabric substrate includes an elastomeric substrate.

Example 34 may include the subject matter of any one of example 31-33, where one or both of the measurement circuit and detection logic are attached to the fabric substrate.

Example 35 may include the subject matter of any one of examples 26-34, further including a battery to apply a voltage to the liquid metal wire.

Example 36 may include the subject matter of any one of examples 26-35, where the liquid metal includes a gallium-based metal.

Example 37 may include the subject matter of example 36, where the liquid metal includes eutectic gallium indium (EGaIn).

Example 38 is a system including: one or more liquid metal cavities and detection logic. The detection logic can include hardware circuitry to: detect a change in an electrical attribute of the one or more liquid metal cavities based on a depression of the one or more liquid metal cavities; and indicate a touch event corresponding to the depression of the one or more liquid metal cavities based on the change in the electrical attribute.

Example 39 may include the subject matter of example 38, further including a microprocessor coupled to the detection logic.

Example 40 may include the subject matter of example 38, where further including a component to: receive a signal generated based on the touch event indicated by the detection logic; and perform an action based on the signal.

Example 41 may include the subject matter of example 40, where component includes a user interface to present information to a user.

Example 42 may include the subject matter of example 41, where the user interface includes one of an indicator light, a speaker, or a display.

Example 43 may include the subject matter of example 40, where the component is to generate data describing the touch event.

Example 44 may include the subject matter of example 43, further including computer memory to store the generated data.

Example 45 may include the subject matter of any one of examples 38-44, where one or more liquid metal cavities are to emit a wireless signal and electrical attribute includes a characteristic of the wireless signal emitted from the one or more liquid metal cavities.

Example 46 may include the subject matter of any one of examples 48-45, where the one or more liquid metal cavities include at least one liquid metal wire.

Example 47 may include the subject matter of any one of examples 48-45, where the one or more liquid metal cavities include at least one liquid metal blister.

Example 48 is a touch sensor including one or more liquid metal cavities and detection logic. The detection logic includes hardware circuitry to: detect a change in an electrical attribute of the one or more liquid metal cavities based on a depression of the one or more liquid metal cavities; and indicate a touch event corresponding to the depression of the one or more liquid metal cavities based on the change in the electrical attribute.

Example 49 may include the subject matter of example 48, where the liquid metal cavities includes an insulating elastomeric covering to enclose a liquid metal.

Example 50 may include the subject matter of example 49, where the liquid metal includes a gallium-based metal.

Example 51 may include the subject matter of any one of examples 48-50, where the one or more liquid metal cavities include at least one liquid metal wire.

Example 52 may include the subject matter of any one of examples 48-51, where the one or more liquid metal cavities include at least one liquid metal blister.

Example 53 may include the subject matter of any one of examples, where the electrical attribute includes impedance of a circuitry including the one or more liquid metal cavities.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

A detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The invention claimed is:

1. A touch sensor comprising:
   a liquid metal wire comprising an elongated tube with a tubular external surface and an internal cavity with a uniform cross-section, wherein the internal cavity is at least partially filled with liquid metal;
   detection logic comprising hardware circuitry to:
      detect a change in an electrical attribute of the liquid metal wire based on a depression of the liquid metal wire at a single point along a length of the liquid metal wire; and
      indicate a touch event corresponding to the depression of the liquid metal wire based on the change in the electrical attribute.

2. The touch sensor of claim 1, wherein the liquid metal wire tube comprises an insulating elastomeric covering to enclose the liquid metal.

3. The touch sensor of claim 1, wherein the liquid metal comprises a gallium-based metal.

4. The touch sensor of claim 3, wherein the liquid metal comprises eutectic gallium indium (EGaIn).

5. The touch sensor of claim 1, further comprising a plurality of liquid metal wires and the detection logic is further to detect a depression of any individual one of the plurality of liquid metal wires.

6. The touch sensor of claim 5, wherein the detection logic is further to determine a location of the touch event based on detection of a depression of two or more of the plurality of liquid metal wires.

7. The touch sensor of claim 6, wherein the depression of the two or more liquid metal wires is concurrent.

8. The touch sensor of claim 6, wherein the depression of the two or more liquid metal wires is in series.

9. The touch sensor of claim 1, wherein the touch event is further based on an intensity of the detected change.

10. The touch sensor of claim 1, wherein the touch event is further based on a pattern of depressions of the liquid metal wire.

11. The touch sensor of claim 1, wherein the touch event is further based on a duration of the depression.

12. The touch sensor of claim 1, wherein the electrical attribute comprises impedance of the liquid metal wire.

13. The touch sensor of claim 1, wherein the liquid metal wire has a round cross-section.

14. The touch sensor of claim 1, wherein the hardware circuit comprises a voltage divider comprising the liquid metal wire and the electrical attribute comprises a voltage measured at the voltage divider.

15. An article comprising:
   a touch interface comprising a touch sensor comprising:
      a liquid metal wire comprising an elongated tube with a tubular external surface and an internal cavity with a uniform cross-section, wherein the internal cavity is at least partially filled with liquid metal;
      detection logic comprising hardware circuitry to:
         detect a change in an electrical attribute of the liquid metal wire based on a depression of the liquid metal wire at a single point along a length of the liquid metal wire; and
         indicate a touch event corresponding to the depression of the one or more liquid metal wires based on the change in the electrical attribute.

16. The article of claim 15, wherein the article comprises a garment and the liquid metal wire is attached to the garment.

17. The article of claim 16, wherein the one or more liquid metal wires are interwoven in the garment.

18. A flexible sensor comprising:
   a single liquid metal wire, wherein the liquid metal wire comprises an elongated, elastomeric cylindrical tube filled with liquid metal, and the cylindrical tube comprises an elongated cylindrical external surface and an internal cavity, wherein the internal cavity has a uniform cross-sectional geometry along the length of the liquid metal wire;
   a measurement circuit coupled to the liquid metal wire to measure impedance across the liquid metal wire; and
   detection logic to detect from the measurement circuit a change in the impedance corresponding to a depression of the liquid metal wire by a force.

19. The flexible sensor of claim 18, wherein the cross-sectional geometry comprises a circular cross-sectional geometry.

20. The flexible sensor of claim 18, wherein the depression compresses a portion of the cross-sectional geometry of the covering corresponding to location of the force.

21. The flexible sensor of claim 18, further comprising a resistor connected in series with the liquid metal wire to form a voltage divider, wherein the measurement circuit is to measure resistance of the liquid metal wire using the voltage divider.

22. The flexible sensor of claim 18, wherein the liquid metal comprises a gallium-based metal.

23. The flexible sensor of claim 22, wherein the liquid metal comprises eutectic gallium indium (EGaIn).

24. The flexible sensor of claim 22, wherein the liquid metal wire is depressable at any point along the external surface of the cylindrical tube.

* * * * *